(12) United States Patent
Sato et al.

(10) Patent No.: US 10,522,790 B2
(45) Date of Patent: Dec. 31, 2019

(54) FILM MEMBER HAVING UNEVEN STRUCTURE

(71) Applicant: JXTG NIPPON OIL & ENERGY CORPORATION, Tokyo (JP)

(72) Inventors: Yusuke Sato, Yokohama (JP); Maki Fukuda, Yokohama (JP); Suzushi Nishimura, Yokohama (JP)

(73) Assignee: JXTG NIPPON OIL & ENERGY CORPORATION, Tokyo (JP)

( * ) Notice: Subject to any disclaimer, the term of this patent is extended or adjusted under 35 U.S.C. 154(b) by 0 days.

(21) Appl. No.: 15/346,386

(22) Filed: Nov. 8, 2016

(65) Prior Publication Data

US 2017/0054112 A1    Feb. 23, 2017

Related U.S. Application Data

(63) Continuation of application No. PCT/JP2015/063573, filed on May 12, 2015.

(30) Foreign Application Priority Data

May 14, 2014    (JP) ................................ 2014-100473

(51) Int. Cl.
  *H01L 51/52*    (2006.01)
  *H01L 51/56*    (2006.01)
(52) U.S. Cl.
  CPC ...... *H01L 51/5275* (2013.01); *H01L 51/5253* (2013.01); *H01L 51/56* (2013.01)
(58) Field of Classification Search
  CPC . H01L 51/52; H01L 51/5275; H01L 51/5253; H01L 51/56
  See application file for complete search history.

(56) References Cited

U.S. PATENT DOCUMENTS 5,747,623 A    5/1998    Matsuo et al.
2008/0176041 A1*    7/2008    Sato ................... H01L 51/0097
                                                  428/161

(Continued)

FOREIGN PATENT DOCUMENTS

JP    H05-238827 A    9/1993
JP    H06-122852 A    5/1994

(Continued)

OTHER PUBLICATIONS

Bates, Christopher et al., "Block Copolymer Lithography". Macromolecules, vol. 47, Issue 2, pp. 2-12 (2014).

(Continued)

*Primary Examiner* — Thanh T Nguyen
(74) *Attorney, Agent, or Firm* — Oliff PLC

(57) ABSTRACT

A film member having a concave-convex structure is composed of a base member; a gas barrier layer formed on the base member; and a concave-convex structure layer formed on a surface of the gas barrier layer, wherein the surface of the gas barrier layer is formed of an inorganic material which is same as a material of the concave-convex structure layer, and the concave-convex structure layer is obtained from a precursor solution applied on the gas barrier layer. The film member having the concave-convex structure has an excellent adhesion property between the concave-convex structure layer and the gas barrier layer, and a high barrier property.

10 Claims, 4 Drawing Sheets

(56) References Cited

U.S. PATENT DOCUMENTS

| | | | |
|---|---|---|---|
| 2012/0132897 A1 | 5/2012 | Seki et al. | |
| 2012/0155093 A1 | 6/2012 | Yamada et al. | |
| 2013/0299796 A1 | 11/2013 | Masuyama et al. | |
| 2014/0264317 A1 | 9/2014 | Uezawa et al. | |
| 2015/0007879 A1* | 1/2015 | Kwon | H01L 31/022441 |
| | | | 136/256 |
| 2015/0028325 A1* | 1/2015 | Seki | G03F 7/0002 |
| | | | 257/40 |
| 2015/0048380 A1* | 2/2015 | Koike | H01L 33/22 |
| | | | 257/76 |
| 2015/0060840 A1* | 3/2015 | Nishimura | H01L 51/5275 |
| | | | 257/40 |

FOREIGN PATENT DOCUMENTS

| | | |
|---|---|---|
| JP | H06-240208 A | 8/1994 |
| JP | H06-299118 A | 10/1994 |
| JP | H06-306329 A | 11/1994 |
| JP | H07-196986 A | 8/1995 |
| JP | H08-112879 A | 5/1996 |
| JP | 2004-052028 A | 2/2004 |
| JP | 2004-198902 A | 7/2004 |
| JP | 2006-236748 A | 9/2006 |
| JP | 2007-114266 A | 5/2007 |
| JP | WO2013/073301 A1 | 5/2013 |
| JP | 2013-109922 A | 6/2013 |
| JP | 2013-114802 A | 6/2013 |
| JP | WO2013/161454 A1 | 10/2013 |
| JP | 2014-038757 A | 2/2014 |
| WO | 2006/095612 A1 | 9/2006 |
| WO | 2011/007878 A1 | 1/2011 |
| WO | 2012/096368 A1 | 7/2012 |

OTHER PUBLICATIONS

Gu, Xiaodan et al., "High Aspect Ratio Sub-15 nm Silicon Trenches From Block Copolymer Templates". Advanced Materials. vol. 24, pp. 5688-5694 (2012).

Tang, Chuanbing et al., "Evolution of Block Copolymer Lithography to Highly Ordered Square Arrays". Science. vol. 322, pp. 429-432 (2008).

Jul. 7, 2015 Written Opinion issued in International Application No. PCT/JP2015/063573.

Jul. 7, 2015 Search Report issued in International Application No. PCT/JP2015/063573.

* cited by examiner

Fig. 5

| | BASE MEMBER | GAS BARRIER LAYER | CONCAVE-CONVEX STRUCTURE LAYER | ADHERSION FORCE (N/m) | STORAGE TEST | | LIGHT EXTRACTION EFFICIENCY (cd/A) |
|---|---|---|---|---|---|---|---|
| | | | | | AFTER 3 DAYS | AFTER 14 DAYS | |
| EXAMPLE 1 | PET | SiO$_x$ | SiO$_x$ | > 20 | + | + | 98 |
| COMPARATIVE EXAMPLE 1 | PET | AlO$_x$ | SiO$_x$ | 4 | ± | - | 95 |
| COMPARATIVE EXAMPLE 2 | PET | (none) | SiO$_x$ | > 20 | - | - | 90 |

FILM MEMBER HAVING UNEVEN STRUCTURE

CROSS REFERENCE TO RELATED APPLICATION

This application is a continuation application of International Patent Application No. PCT/JP2015/063573 filed on May 12, 2015 claiming the benefit of priority of Japanese Patent Application No. 2014-100473 filed on May 14, 2014. The contents of International Patent Application No. PCT/JP2015/063573 and Japanese Patent Application No. 2014-100473 are incorporated herein by reference in their entities.

BACKGROUND OF THE INVENTION

Field of the Invention

The present invention relates a film member having a concave-convex structure.

Description of the Related Art

Light emitting elements expected as next-generation of displays or illumination devices include an organic EL element (organic Electro-Luminescence element or organic light emitting diode). In the organic EL element, a hole injected from an anode via a hole injecting layer and electron injected from a cathode via an electron injecting layer are carried to a light emitting layer respectively, then the hole and electron are recombined on an organic molecule in the light emitting layer to excite the organic molecule, thereby generating light emission. Therefore, when the organic EL element is used as the display device or the illumination device, the light from the light emitting layer is required to be efficiently extracted from the surface of the organic EL element. In order to meet this demand, it is known from Japanese Patent Application Laid-open No. 2006-236748 that a diffraction grating substrate having a concave-convex structure (uneven structure) is provided on a light extraction surface of the organic EL element.

Further, as a base member of the organic EL element, a film base member such as a film base member which is formed of a resin, which is light weight and flexible, and can be produced in a large size, has started to be adopted, in place of a glass substrate which is heavy weight, easily broken and hard to be produced in a large size. The film base member such as the resin film base member, however, has a problem that the film base member has a gas barrier property inferior to that of the glass substrate. In some cases, any moisture and/or oxygen lower the brightness and/or luminous efficacy (light-emitting efficiency), etc. of the organic EL element. For this reason, in a case that a resin film base member is used as the base member of the organic EL element, it is necessary that a gas barrier layer is formed for the purpose of preventing any deterioration due to the moisture and/or a gas such as oxygen. For example, International Publication No. WO 2006/095612 A1 describes a film member for an organic EL element in which a gas barrier layer made of silicon oxide is formed on a resin film base member, and a concave-convex structure layer made of polymethyl methacrylate (PMMA) is formed on the gas barrier layer.

SUMMARY OF THE INVENTION

The Applicant of the present application found out, through researches and investigation conducted by the Applicant, that the adhesion force between the gas barrier layer and the concave-convex structure layer is weak in a film member such as that described in International Publication No. WO2006/095612 A1, and that the concave-convex structure layer is detached (exfoliated or peeled off) from the gas barrier layer during the manufacture process of the film member. In view of this situation, an object of the present invention is to provide a film member which has excellent adhesion property between the concave-convex structure layer and the gas barrier layer, and which has high gas barrier property.

According to a first aspect of the present invention, there is provided a film member having a concave-convex structure, the film member comprising:
a base member;
a gas barrier layer formed on the base member; and
a concave-convex structure layer formed on a surface of the gas barrier layer,
wherein the surface of the gas barrier layer is formed of an inorganic material which is same as a material of the concave-convex structure layer, and the concave-convex structure layer is obtained from a precursor solution applied on the gas barrier layer.

In the film member, the gas barrier layer may be a single layer film.

In the film member, (i) each of a plurality of convexities and each of a plurality of concavities of the concave-convex structure layer may have an elongated shape which extends while winding (waving) in a plane view; and
(ii) the plurality of convexities may have extending directions, bending directions and lengths which are non-uniform among the plurality of convexities, and the plurality of concavities may have extending directions, bending directions and lengths which are non-uniform among the plurality of concavities.

In the film member, adhesion force between the gas barrier layer and the concave-convex structure layer may be greater than 4 N/m.

In the film member, an average pitch of a plurality of concavities and a plurality of convexities of the concave-convex structure layer may be in a range of 100 nm to 1500 nm; and
an average value of depth distribution of the plurality of concavities and the plurality of convexities may be in a range of 20 nm to 200 nm.

According to a second aspect of the present invention, there is provided a method of producing the film member having the concave-convex structure of the first aspect, the method including:
forming the gas barrier layer on the base member;
forming a film by applying the precursor solution onto the gas barrier layer; and
pressing a mold having a concave-convex pattern against the film while curing the film so as to transfer the concave-convex pattern of the mold to the film.

The method of producing the film member may further include producing the mold having the concave-convex pattern by utilizing self-organization of a block copolymer. Further, the block copolymer may be self-organized by a solvent annealing.

According to a third aspect of the present invention, there is provided an organic EL element formed by successively stacking, on the film member of the first aspect, a first electrode, an organic layer and a metal electrode.

Since the film member having the concave-convex structure of the present invention includes the gas barrier layer and the concave-convex structure layer which are formed on the base member, the film member has excellent gas barrier property and high light extraction efficiency. Accordingly, a light emitting element produced by using the film member has a high light emitting efficiency and a long service life due to the suppression of the deterioration caused by the moisture and/or gas such as oxygen. Further, since the surface, of the gas barrier layer, which makes contact with the concave-convex structure layer is made of an inorganic material which is same as a material of the concave-convex structure layer, the adhesion property between the gas barrier layer and the concave-convex structure layer is high, and thus the concave-convex structure layer does not peel off (exfoliate) from the gas barrier layer. Therefore, the film member having the concave-convex structure of the present invention is quite effective for a various kinds of devices such as organic EL elements, solar batteries, etc.

BRIEF DESCRIPTION OF THE DRAWINGS

FIGS. 4A to 4C are each a schematic cross-sectional view of a light-emitting element of an embodiment, wherein FIG. 4A depicts an example of a schematic cross-sectional view of the light-emitting element wherein a concave-convex pattern of a film member is maintained in a surface of an organic layer; FIG. 4B depicts an example of a schematic cross-sectional view of a light-emitting element wherein a surface of an organic layer is flat; and FIG. 4C depicts an example of a schematic cross-sectional view of a light-emitting element provided with an optical functional layer.

FIG. 5 is a table indicating the materials of film members produced in Example and Comparative Examples, and the results of evaluation therefor.

DESCRIPTION OF THE PREFERRED EMBODIMENTS

In the following, an embodiment of a film member having a concave-convex structure, an embodiment of a method for producing the film member, and an embodiment of a light-emitting element produced by using the film member having the concave-convex structure according to the present invention will be explained, with reference to the drawings.

[Film Member]

Figure 1:
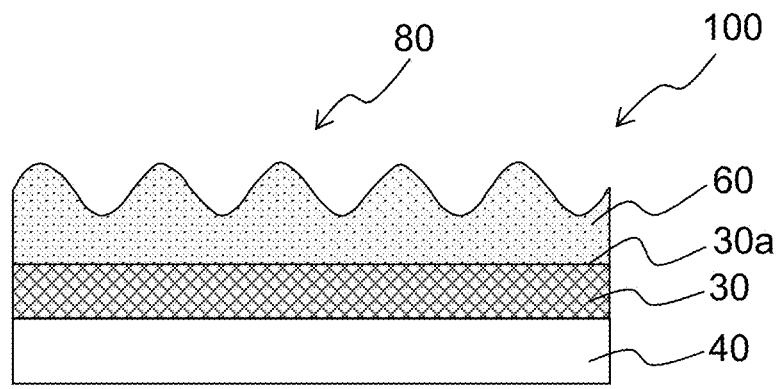
FIG. 1 is a schematic cross-sectional view of a film member having a concave-convex structure of an embodiment.

A film member 100 having a concave-convex structure (concave-convex pattern) of an embodiment has such a configuration wherein a gas barrier layer 30 and a concave-convex structure layer 60 are formed in this order on a film base member 40, as depicted in FIG. 1.

<Film Base Member>

The film base member 40 is not particularly limited, and it is possible to appropriately use any publicly known transparent substrate which can be used for the light emitting element. Those usable as the film base member 40 include, for example, substrates made of resins such as polyester (polyethylene terephthalate, polybutylene terephthalate, polyethylene naphthalate, polyarylate, and the like), an acrylic-based resin (polymethyl methacrylate and the like), polycarbonate, polyvinyl chloride, a styrene-based resin (ABS resin and the like), a cellulose-based resin (triacetyl cellulose and the like), a polyimide-based resin (polyimide resin, polyimideamide resin, and the like) and cycloolefin polymer; and the like. In a case that the film member 100 is used as an optical substrate of the light-emitting element, the base member 40 is preferably a base member having the heat-resisting property, the weather resisting property against UV light, etc. It is allowable to perform a surface treatment for the base member 40 or to provide an easy-adhesion layer on the base member 40 so as to improve the adhesion property of the base member 40. Further, it is also allowable to provide a smoothing layer in order to cover any projection on the surface of the film member. The thickness of the film base member 40 is preferably in a range of 1 μm to 2000 μm.

<Gas Barrier Layer>

The gas barrier layer 30 is a layer for preventing permeation of oxygen and water vapor; a material constructing the gas barrier layer 30 is preferably an inorganic material such as a metallic oxide, a metallic nitride, a metallic sulfide, a metal carbide, etc., and is further preferably an inorganic material such as a silicon oxide, an aluminum oxide, a silicon nitride, a silicon oxynitride, an aluminum oxynitride, a magnesium oxide, a zinc oxide, an indium oxide, a tin oxide, etc. The gas barrier layer 30 may be a single layer film of any one of these material, or a multi-layered film formed by stacking a plurality of kinds of these materials. Alternatively, the gas barrier layer 30 may be a multi-layered film formed by stacking a plurality of layers including an organic material and at least one of the above-described inorganic materials. In a case that the gas barrier layer 30 is a multi-layered film, it is allowable to provide a stress relaxation layer between the layers. A surface (surface making contact with the concave-convex structure layer 60) 30a of the gas barrier layer 30 is composed of the material same as an inorganic material composing the concave-convex structure layer 60, which in turn increases the adhesion property between the gas barrier layer 30 and the concave-convex structure layer 60. Further, the gas barrier layer 30 preferably has a light-transmissivity. With this, the film member 100 can be used as an optical substrate for a light-emitting element such as an organic EL element. The gas barrier layer 30 preferably has a transmissivity of not less than 80% at a measurement wavelength of 550 nm, more preferably has a transmissivity of not less than 90% at the measurement wavelength of 550 nm. Further, it is allowable to perform, for the gas barrier layer 30, a surface treatment for enhancing the adhesion property of the gas barrier layer 30 with respect to the concave-convex structure layer 60 such as a plasma treatment, a corona treatment, etc.

The thickness of the gas barrier layer 30 is preferably in a range of 5 nm to 2000 nm. In a case that the thickness is less than 5 nm, there are many cases of film defect, and any sufficient moisture-preventing effect (gas barrier effect) cannot be obtained. On the other hand, in a case that the thickness exceeds 2000 nm, although the moisture-preventing effect is theoretically high, the internal stress is high, which in turn makes the gas barrier layer 30 to be brittle. This makes it impossible to obtain any desired moisture-preventing effect, as well as leads to such a fear that any cracking, etc., might occur in the gas barrier layer 30 due to any external factor such as bending, pulling, etc. after the film formation. As a result, it is difficult to impart the flexibility to the film member 100.

<Concave-Convex Structure Layer>

Figure 2A:
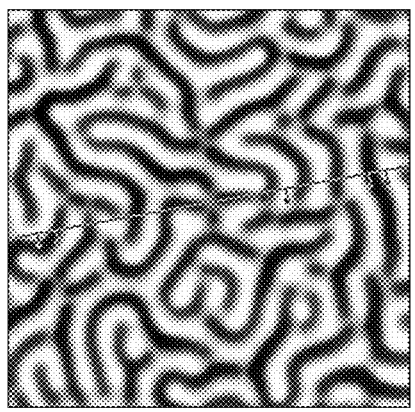
FIG. 2A is a schematic plane view of a concave-convex pattern of the film member having the concave-convex structure of the embodiment.
Figure 2B:
FIG. 2B depicts a cross-sectional profile on a cutting line in the schematic plane view in FIG. 2A.

The concave-convex structure layer 60 is a layer having a fine or minute concave-convex pattern (concave-convex structure) 80 formed on a surface thereof. The minute concave-convex pattern 80 may be any pattern such as a pattern having a lens structure, a structure having a light diffusion function, a light diffraction function, etc. FIG. 2A depicts an example of a schematic plane view of the concave-convex pattern 80 of the concave-convex structure 60 of the embodiment, and FIG. 2B depicts a cross-sectional profile on a cutting line in the schematic plane view in FIG. 2A. The cross-sectional shape of the concave-convex structure layer 60 may be formed of relatively gently inclined surfaces and may construct a waveform (in the present application, referred to as "waveform structure", as appropriate) upward from the base member 40, as depicted in FIG. 2B. Namely, convexities of the concave-convex pattern 80 have a cross-sectional shape which is narrowing from the base portion, of each convexity, located on the side of the base member 40 toward the apex portion of each convexity. The concave-convex pattern 80 of the concave-convex structure layer 60 may have such a characteristic that, as in FIG. 2A depicting an example of a schematic plane view of the concave-convex pattern 80, a plurality of convexities (white portions) and a plurality of concavities (black portions) have an elongated shape extending while winding (waving, meandering), and that the convexities and the concavities in the concave-convex pattern 80 have the extending directions, winding direction (bending directions) and extending lengths which are irregular in a plane view. Accordingly, the concave-convex pattern 80 is clearly different from a regularly arranged pattern such as stripe, waved stripe, zigzag, etc., or a regularly arranged pattern such as dot-shaped pattern, etc. The concave-convex pattern 80 does not include such a regularly arranged pattern, and can be distinguished, in view of this point, from a pattern, such as a circuit pattern, which has a regularity and/or many linear portions or straight lines, etc. Since the concave-convex structure layer 60 (the concave-convex pattern 80) has the above-described characteristics, even under a condition that the concave-convex structure layer 60 is cut in any plane orthogonal to a surface of the base member 40, the concave-convex cross-sectional shape consequently appears repeatedly. Further, a part (portion) or the entirety of the convexities and the concavities of the concave-convex pattern 80 may be branched at an intermediate portion thereof, in a plane view (see FIG. 2A). Note that in FIG. 2A, the pitch of the convexities appears to be uniform as a whole. Furthermore, in the concave-convex pattern 80, the concavities are defined by the convexities, and extend along the convexities.

In order that the concave-convex structure layer 60 functions as a diffraction grating, the average pitch of concavities and convexities is preferably in a range of 100 nm to 1500 nm. In a case that the average pitch of the concavities and convexities is less than the above-described lower limit, the pitch is too small with respect to the wavelength of a visible light, and the diffraction of the light by the concavities and convexities is less likely to occur. On the other hand, in a case that the average pitch of the concavities and convexities exceeds the above-described upper limit, the diffraction angle is so small that functions as the diffraction grating are more likely to be lost. The average pitch of the concavities and convexities is more preferably in a range of 200 nm to 1200 nm. The average value of the depth distribution of the concavities and convexities is preferably in a range of 20 nm to 200 nm. In a case that the average value of the depth distribution of the concavities and convexities is less than the above-described lower limit, the depth is too small with respect to the wavelength of the visible light, and thus any necessary diffraction is less likely to be generated. On the other hand, in a case that the average value of the depth distribution of the concavities and convexities exceeds the above-described upper limit, the intensity of diffracted light is likely to become non-uniform, which in turn results in, for example in a case that an organic EL element is produced by using the film member 100, non-uniform electric field distribution in an organic layer in the organic EL element, generating such a tendency that the electric field is concentrated in a certain location and thus easily generating a leakage current, and/or that the service life of the organic EL element is shortened. The average value of the depth distribution of the concavities and convexities is more preferably in a range of 30 nm to 150 nm. The standard deviation of the depths of convexities and concavities is preferably in a range of 10 nm to 100 nm. In a case that the standard deviation of the depths of concavities and convexities is less than the lower limit, the depth is so short relative to the wavelengths of the visible light that the required diffraction is less likely to occur. On the other hand, in a case that the standard deviation of the depths of concavities and convexities exceeds the upper limit, the intensity of diffracted light is likely to become non-uniform, which in turn results in, for example in a case that an organic EL element is produced by using the film member 100, non-uniform electric field distribution in the organic layer in the organic EL element, generating such a tendency that the electric field is concentrated in a certain location and thus easily generating a leakage current, and/or that the service life of the organic EL element is shortened. The standard deviation of the depths of convexities and concavities is more preferably within a range of 15 nm to 75 nm.

In the present application, the term "average pitch of concavities and convexities" means an average value of the pitch of concavities and convexities in a case of measuring the pitch of the concavities and convexities (spacing distance between adjacent convex portions or spacing distance between adjacent concave portions) in a surface on which the convexities and concavities are formed. Such an average value of the pitch of concavities and convexities can be obtained as follows. Namely, a concavity and convexity analysis image is obtained by measuring the concavities and convexities on the surface by using a scanning probe microscope (for example, a scanning probe microscope manufactured by HITACHI HIGH-TECH SCIENCE CORPORATION, under the product name of "E-sweep", etc.), under the following measurement conditions, then the distances between randomly selected concave portions or convex portions adjacent to each other are measured at not less than 100 points in the concavity and convexity analysis image, and then the average of the distances is arithmetically calculated and is determined as the average pitch of concavities and convexities.

The measurement conditions are as follows:
Measurement mode: cantilever intermittent contact mode
Material of the cantilever: silicon
Lever width of the cantilever: 40 μm
Diameter of tip of chip of the cantilever: 10 nm Further, in the present application, the average value of the depth distribution of concavities and convexities and the standard deviation of the depths of concavities and convexities can be calculated by the following manner. Namely, a concavity and convexity analysis image is obtained by measuring the shape of the concavities and convexities on the surface by using a scanning probe microscope (for example, a scanning probe microscope manufactured by HITACHI HIGH-TECH SCIENCE CORPORATION, under the product name of "E-sweep", etc.). When performing the analysis of the concavities and convexities, the measurement is performed in a randomly selected measurement region of 3 μm square (vertical: 3 μm, horizontal: 3 μm) or in a randomly selected measurement region of 10 μm square (vertical: 10 μm, horizontal: 10 μm) under the above-described conditions. When doing so, data of height of concavities and convexities at not less than 16,384 points (vertical: 128 points×horizontal: 128 points) are obtained within the measurement region, each in nanometer scale. Note that although the number of measurement points is different depending on the kind and/or setting of the measurement device which is used, for example in a case of using the above-described scanning probe microscope manufactured by HITACHI HIGH-TECH SCIENCE CORPORATION, under the product name of "E-sweep" as the measurement device, it is possible to perform the measurement at measurement points of 65,536 points (vertical: 256 points×horizontal: 256 points; namely, the measurement in a resolution of 256×256 pixels) within the measurement region of 3 μm square. Then, with respect to the height of concavities and convexities (unit: nm) measured in such a manner, at first, a measurement point "P" is determined, among all the measurement points, which is the highest from the surface of the substrate. Then, a plane which includes the measurement point P and which is parallel to the surface of the substrate is determined as a reference plane (horizontal plane), and a depth value from the reference plane (difference obtained by subtracting, from the value of height from the substrate at the measurement point P, the height from the substrate at each of the measurement points) is obtained as the data of depth of concavities and convexities. Note that such a depth data of the concavities and convexities can be obtained, for example, by performing automatic calculation with software in the measurement device (for example, the above-described scanning probe microscope manufactured by HITACHI HIGH-TECH SCIENCE CORPORATION, under the product name of "E-sweep"), and the value obtained by the automatic calculation in such a manner can be utilized as the data of depth of concavities and convexities. After obtaining the data of depth of concavity and convexity at each of the measurement points in this manner, the values, which can be calculated by obtaining the arithmetic average value and the standard deviation of the obtained data of depths of concavity and convexity, are adopted as the average value of the depth distribution of concavities and convexities and the standard deviation of the depths of concavities and convexities. In this specification, the average pitch of concavities and convexities and the average value of the depth distribution of concavities and convexities can be obtained via the above-described measuring method, regardless of the material of the surface on which the concavities and convexities are formed.

The concave-convex pattern 80 may a quasi-periodic pattern in which a Fourier-transformed image, obtained by performing a two-dimensional fast Fourier-transform processing on a concavity and convexity analysis image obtained by analyzing a concave-convex shape on the surface, shows a circular or annular pattern, namely, such a quasi-periodic pattern in which, although concavities and convexities have no particular orientation (directionality), the pattern has the distribution of pitches of concavities and convexities (pitches of concavities and convexities vary). Therefore, the film member having such a quasi-periodic pattern is suitable for a diffraction substrate used in a surface-emitting element, such as the organic EL element, provided that the film member has concavities and convexities of which pitch distribution or pitch variability enables the film member to diffract visible light.

As the material of the concave-convex structure layer 60, an inorganic material may be used. In particular, it is allowable to use an inorganic material exemplified by silicon-based materials such as silica, SiN, SiON and the like; titanium (Ti)-based materials ($TiO_2$ and the like); materials based on indium-tin oxide (ITO); and ZnO, ZnS, $ZrO_2$, $Al_2O_3$, $BaTiO_3$, and $SrTiO_2$; and the like. By forming the concave-convex structure layer 60 of such an inorganic material, it is possible to further suppress the permeation of the oxygen and the water vapor through the film member 100. Such a concave-convex structure layer 60 can be formed by: applying a solution (a precursor solution) of a precursor of the inorganic material on the gas barrier layer so as to form a film; and by curing the film by means of a reaction, drying, etc., as will be described later on. Further, as described above, the concave-convex structure layer 60 is preferably formed of a material same as the material forming the surface 30*a* of the gas barrier layer 30 (a surface, of the gas barrier layer 30, which makes contact with the concave-convex structure layer 60). By doing so, the adhesion property between the gas barrier layer 30 and the concave-convex structure layer 60 is improved.

The thickness of the concave-convex structure layer 60 is preferably in a range of 100 nm to 10 μm. In a case that the thickness of the concave-convex structure layer 60 is less than 100 nm, the transfer of the concave-convex shape by imprinting as described later is difficult. On the other hand, in a case that the thickness of the concave-convex structure layer 60 exceeds 10 μm, any structural defect such as a crack is more likely to occur. Here, the "thickness of the concave-convex structure layer 60" in this context means an average value of distances from the bottom surface of the concave-convex structure layer 60 to the surface in which the concave-convex pattern is formed.

The adhesion force between the concave-convex structure layer 60 and the gas barrier layer 30 is preferably greater than 4 N/m. With this, in a production process of the film member 100 or in a production process a various kinds of devices such as an optical element using the film member 100, etc., it is possible to prevent any layer detachment or exfoliation from occurring between the concave-convex structure layer 60 and the gas barrier layer 30. The adhesion force between the concave-convex structure layer 60 and the gas barrier layer 30 can be measured, for example, in the following manner. Namely, gas barrier layers are formed on two film base members, respectively; and a solution (a precursor solution) of a precursor of an inorganic material, which is same as the inorganic material used for forming the concave-convex structure layer, is further applied on one film base member, of the two film base members, so as to form a coating film of the precursor solution thereon. Then, after overlapping the two film base members such that the coating film of the precursor solution formed on the one film member of the two film base members makes contact with the gas barrier layer formed on the other film member of the two film base members, the coating film of the precursor solution is cured to thereby form an inorganic material layer. Namely, a sample having a structure composed of the film base member/the gas barrier layer/the inorganic material layer/the gas barrier layer/the film base member is obtained. In this sample, the inorganic material layer is a layer which is formed of the inorganic material same as the inorganic material forming the concave-convex structure layer. The film base members, each of which is the uppermost layer or the lowermost layer of this sample, are held respectively to be peeled at a constant speed in a 180-degree direction (to be peeled in a T-shaped manner). Then, the sample is divided (torn) into two portions from the weakest interface. The peel strength (peeling force) at this time is measured by using, for example, a tensile tester (mode name: Strograph E-L; manufactured by TOYO SEIKI SEISAKU-SHO, LTD.), etc. The measured peel strength indicates the adhesion force of the peeled interface. The adhesion force between the gas barrier layer and the concave-convex structure layer can be appreciated from the measure value of the peel strength in the case that the peeling occurs at the interface between the gas barrier layer and the concave-convex structure layer. Note that in such a case that the adhesion force between the respective layers is greater than the strength of the film base member, the gas barrier layer or the concave-convex structure layer itself, the sample is to be torn (broken) from the base member or from a location inside the layer, rather than from the interface between the respective layers.

[Method of Producing Film Member]

Next, a method of producing a film member having the concave-convex structure of the embodiment will be explained. The film member having the concave-convex structure of the embodiment can be produced by a nano-imprint method as explained below. The method of producing such a film member 100 having the concave-convex structure of the embodiment mainly includes: a gas barrier layer forming step of forming a gas barrier layer on a film base member; a solution preparation step of preparing a precursor solution (a solution of a precursor of an inorganic material); a coating step of coating the gas barrier layer with the prepared precursor solution to form a coating film (a film of the precursor); a transfer step of transferring a concave-convex pattern of a mold to the coating film on the gas barrier layer by pressing the mold against the coating film while curing (pre-curing) the coating film; and a main curing step of performing main curing for the coating film. In the following, the respective steps will be explained in the above order.

<Gas Barrier Layer Forming Step>

At first, a gas barrier layer is formed on a film base member. For example, the gas barrier layer can be formed by a wet method such as the sol-gel method. Specifically, an alkoxide such as silicon alkoxide, titanium alkoxide, etc., is used as a metal compound raw material to be applied on the base member by means of the spraying method, the spin coating method, etc., to form a film; and then the formed film is cured (subjected to the gelation), thereby making it possible to form the gas barrier layer. Alternatively, the gas barrier layer may be formed on the film base member by the sputtering method, the ion-assisted method, or by the plasma CVD method, the plasma CVD method under atmospheric pressure or in the vicinity thereof, as will be described later on. Still alternatively, it is allowable to form a multi-layered film, as the gas barrier layer, by stacking a plurality of materials in any of the above-described methods. In any of cases that the gas barrier layer is a multi-layered film or a single layer film, the uppermost surface (a surface making contact with the concave-convex structure layer) of the gas barrier layer is preferably formed of a material same as that forming the concave-convex structure layer. With this, the adhesion force between the concave-convex structure layer and the gas barrier layer can be improved.

With the wet system (wet method) such as the sol-gel method using the spraying method and the spin coating method, it is difficult to obtain the smoothness (evenness) in the molecular level (nm level). Further, since the wet system uses a solvent, there is limitation to usable base members or usable solvents in a case that the base member is made of an organic material. Accordingly, it is preferred that the gas barrier layer is formed by the plasma CVD method, the plasma CVD method under atmospheric pressure or in the vicinity thereof, as will be described later on. Among these methods, in particular, the forming method by the plasma CVD method under atmospheric pressure is preferred since this method does not require any decompression chamber, etc., is capable of performing the film formation at a high speed, and has a high productivity.

The details of the film forming method by the plasma CVD method under atmospheric pressure is described, for example, in Japanese Patent Application Laid-open Nos. 2004-052028, 2004-198902, etc. The method uses an organometallic compound as the raw material, and it is allowable to use the raw material compound in either a gaseous, liquid or solid state at normal temperature under normal pressure. In a case that the raw material compound is used in its gaseous state, the raw material compound can be introduced as it is into a discharge space; on the other hand, in a case that the raw material compound is in a liquid or solid state, the material is used after being gasified once by means of heating, bubbling, decompression, ultrasonic radiation, etc. In view of such a situation, preferred organometallic compounds include, for example, a metal alkoxide of which boiling point is not more than 200° C.

Examples of such metal alkoxide include a silicon compound such as silane, tetramethoxysilane, tetraethoxysilane (TEOS), tetra-n-propoxysilane, etc.; a titanium compound such as titanium methoxide, titanium ethoxide, titanium isopropoxide, titanium tetraisopropoxide, etc.; a zirconium compound such as zirconium-n-propoxide, etc.; an aluminum compound such as aluminum ethoxide, aluminum triisopropoxide, aluminum isopropoxide, etc.; antymony ethoxide; arsenic triethoxide; zinc acetylacetonate; diethylzinc; and the like.

Further, cracking gas is used together with the gaseous raw material containing these organometallic compounds to compose a reactive gas, for the purpose of cracking the organometallic compounds to thereby obtain an inorganic compound. The cracking gas is exemplified by a hydrogen gas, water vapor, etc.

In the plasma CVD method, a discharge gas easily turned to a plasma state is mainly mixed with the reactive gas. As the discharge gas, for example, a nitrogen gas; a rare gas such as a gas of an element of the eighteenth group of the periodic table, specifically, helium, neon, argon, etc.; and the like, can be used. In particular, the nitrogen gas is preferred in view of the production cost.

The film formation is performed by mixing the discharge gas with the reactive gas to thereby obtain a mixed gas, and by supplying the mixed gas to a discharge plasma generating apparatus (plasma generator). The ratio of the discharge gas relative to the reactive gas is different depending on the property of a film as an object to be formed, for example, the percentage of the discharge gas is not less than 50% in the entire mixed gas.

For example, the metal alkoxide or the silicon alkoxide (such as tetraethoxysilane (TEOS)) of which boiling point is not more than 200° C., is used as the raw material compounds, oxygen is used as the cracking gas, and the rare gas or an inert gas such as nitrogen is used as the discharge gas, and the plasma discharge is performed. In such a case, it is possible to form a film of silicon oxide (silicon oxide film) as the gas barrier layer of the embodiment.

Note that for the purpose of forming a concave-convex structure layer having a desired concave-convex pattern on the gas barrier layer, a surface of the gas barrier layer (including a surface obtained by a surface treatment and/or a surface of an easy-adhesion layer as well in a case that any surface treatment is performed and/or any easy-adhesion layer is provided) may be flat or smooth.

<Solution Preparation Step>

In order to form a concave-convex structure layer made of an inorganic material, a solution of a precursor of the inorganic material is prepared. For example, in a case that the concave-convex structure layer made of the inorganic material is formed by using the sol-gel method, a metal alkoxide as a precursor is prepared. For example, in a case that concave-convex structure layer made of silica is formed on a base member, it is possible to use, as the precursor of silica (silica precursor): tetraalkoxide monomers represented by tetraalkoxysilane such as tetramethoxysilane (TMOS), tetraethoxysilane (TEOS), tetra-i-propoxysilane, tetra-n-propoxysilane, tetra-i-butoxysilane, tetra-n-butoxysilane, tetra-sec-butoxysilane, tetra-t-butoxysilane, etc.; trialkoxide monomers represented by trialkoxysilane such as methyl trimethoxysilane, ethyl trimethoxysilane, propyl trimethoxysilane, isopropyl trimethoxysilane, phenyl trimethoxysilane, methyl triethoxysilane (MTES), ethyl triethoxysilane, propyl triethoxysilane, isopropyl triethoxysilane, phenyl triethoxysilane, methyl tripropoxysilane, ethyl tripropoxysilane, propyl tripropoxysilane, isopropyl tripropoxysilane, phenyl tripropoxysilane, methyl triisopropoxysilane, ethyl triisopropoxysilane, propyl triisopropoxysilane, isopropyl triisopropoxysilane, phenyl triisopropoxysilane, tolyltriethoxysilane, etc.; dialkoxide monomers represented by dialkoxysilane such as dimethyl dimethoxysilane, dimethyl diethoxysilane, dimethyl dipropoxysilane, dimethyl diisopropoxysilane, dimethyl di-n-butoxysilane, dimethyl di-i-butoxysilane, dimethyl di-sec-butoxysilane, dimethyl di-t-butoxysilane, diethyl dimethoxysilane, diethyl diethoxysilane, diethyl dipropoxysilane, diethyl diisopropoxysilane, diethyl di-n-butoxysilane, diethyl di-i-butoxysilane, diethyl di-sec-butoxysilane, diethyl di-t-butoxysilane, dipropyl dimethoxysilane, dipropyl diethoxysilane, dipropyl dipropoxysilane, dipropyl diisopropoxysilane, dipropyl di-n-butoxysilane, dipropyl di-i-butoxysilane, dipropyl di-sec-butoxysilane, dipropyl di-t-butoxysilane, diisopropyl dimethoxysilane, diisopropyl diethoxysilane, diisopropyl dipropoxysilane, diisopropyl diisopropoxysilane, diisopropyl di-n-butoxysilane, diisopropyl di-i-butoxysilane, diisopropyl di-sec-butoxysilane, diisopropyl di-t-butoxysilane, diphenyl dimethoxysilane, diphenyl diethoxysilane, diphenyl dipropoxysilane, diphenyl diisopropoxysilane, diphenyl di-n-butoxysilane, diphenyl di-i-butoxysilane, diphenyl di-sec-butoxysilane, diphenyl di-t-butoxysilane, etc. Further, it is also possible to use alkyltrialkoxysilane and dialkyldialkoxysilane in each of which an alkyl group has carbon numbers of C4 to C18. It is also allowable to use metal alkoxide such as: monomers having vinyl group such as vinyltrimethoxysilane, vinyltriethoxysilane, etc.; monomers having epoxy group such as 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, etc.; monomers having styryl group such as p-styryltrimethoxysilane, etc.; monomers having methacrylic group such as 3-methacryloxypropylmethyldimethoxysilane, 3-methacryloxypropyltrimethoxysilane, 3-methacryloxypropylmethyldiethoxysilane, 3-methacryloxypropyltriethoxysilane, etc.; monomers having acrylic group such as 3-acryloxypropyltrimethoxysilane, etc.; monomers having amino group such as N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, etc.; monomer having ureide group such as 3-ureidepropyltriethoxysilane, etc.; monomers having mercapto group such as 3-mercaptopropylmethyldimethoxysilane, 3-mercaptopropyltrimethoxysilane, etc.; monomers having sulfide group such as bis(triethoxysilylpropyl) tetrasulfide, etc.; monomers having isocyanate group such as 3-isocyanatopropyltriethoxysilane, etc.; polymers obtained by polymerizing the foregoing monomers in small amounts; and composite materials characterized in that functional group and/or polymer is/are introduced into a part of the material as described above. Further, a part of or all of the alkyl group and the phenyl group of each of these compounds may be substituted with fluorine. Further, examples of the silica precursor include metal acetylacetonate, metal carboxylate, oxychloride, chloride, and mixtures thereof. The silica precursor, however, is not limited to these. In addition to Si, examples of the metal species include Ti, Sn, Al, Zn, Zr, In, and mixtures thereof, but are not limited thereto. It is also possible to use any appropriate mixture of precursors of the oxides of the above metals. Further, it is possible to use, as the silica precursor, a silane coupling agent having, in its molecule, a hydrolysis group having the affinity and the reactivity with silica and an organic functional group having the water-repellence. For example, there are exemplified silane monomer such as n-octyltriethoxysilane, methyltriethoxysilane, methyltrimethoxysilane, etc.; vinyl silane such as vinyltriethoxysilane, vinyltrimethoxysilane, vinyltris(2-methoxyethoxy)silane, vinylmethyldimethoxysilane, etc.; methacrylsilane such as 3-methacryloxypropyltriethoxysilane, 3-methacryloxypropyltrimethoxysilane, etc.; epoxysilane such as 2-(3, 4-epoxycyclohexyl)ethyltrimethoxysilane, 3-glycidoxypropyltrimethoxysilane, 3-glycidoxypropyltriethoxysilane, etc.; mercaptosilane such as 3-mercaptopropyltrimethoxysilane, 3-mercaptopropyltriethoxysilane, etc.; sulfursilane such as 3-octanoylthio-1-propyltriethoxysilane, etc.; aminosilane such as 3-aminopropyltriethoxysilane, 3-aminopropyltrimethoxysilane, N-(2-aminoethyl)-3-aminopropyltrimethoxysilane, N-(2-aminoethyl)-3-aminopropylmethyldimethoxysilane, 3-(N-phenyl)-aminopropyltrimethoxysilane, etc.; polymers obtained by polymerizing the monomers as described above; and the like.

In a case that a mixture of TEOS and MTES is used as the precursor of the inorganic material, the mixture ratio thereof can be, for example, 1:1 in a molar ratio. The precursor produces amorphous silica by being subjected to the hydrolysis and polycondensation reaction. An acid such as hydrochloric acid or an alkali such as ammonia is added in order to adjust the pH of the solution as a synthesis condition. The pH is preferably not more than 4 or not less than 10. Water may be added to perform the hydrolysis. The amount of water to be added can be not less than 1.5 times, with respect to the amount of metal alkoxide species, in the molar ratio.

Examples of a solvent of the precursor solution used in the sol-gel method include alcohols such as methanol, ethanol, isopropyl alcohol (IPA), butanol, etc.; aliphatic hydrocarbons such as hexane, heptane, octane, decane, cyclohexane, etc.; aromatic hydrocarbons such as benzene, toluene, xylene, mesitylene, etc.; ethers such as diethyl ether, tetrahydrofuran, dioxane, etc.; ketones such as acetone, methyl ethyl ketone, isophorone, cyclohexanone, etc.; ether alcohols such as butoxyethyl ether, hexyloxyethyl alcohol, methoxy-2-propanol, benzyloxyethanol, etc.; glycols such as ethylene glycol, propylene glycol, etc.; glycol ethers such as ethylene glycol dimethyl ether, diethylene glycol dimethyl ether, propylene glycol monomethyl ether acetate, etc.; esters such as ethyl acetate, ethyl lactate, γ-butyrolactone, etc.; phenols such as phenol, chlorophenol, etc.; amides such as N,N-dimethylformamide, N,N-dimethylacetamide, N-methylpyrrolidone, etc.; halogen-based solvents such as chloroform, methylene chloride, tetrachloroethane, monochlorobenzene, dichlorobenzene, etc.; hetero-element containing compounds such as carbon disulfide, etc.; water; and mixture solvents thereof. Especially, ethanol and isopropyl alcohol are preferable. Further, a mixture of water and ethanol, and a mixture of water and isopropyl alcohol are also preferable.

As an additive of the precursor solution used in the sol-gel method, it is possible to use polyethylene glycol, polyethylene oxide, hydroxypropylcellulose, and polyvinyl alcohol for viscosity adjustment; alkanolamine such as triethanolamine, β-diketone such as acetylacetone, β-ketoester, formamid, dimetylformamide, and dioxane, etc., as a solution stabilizer. Further, it is possible to use, as an additive to the precursor solution, a material which generates an acid or alkali by being irradiated with light such as energy rays represented by ultraviolet rays such as excimer UV light. By adding such a material, the precursor solution can be gelled (cured) by being irradiated with light, thereby making it possible to form the inorganic material.

Alternatively, a polysilazane solution may be used as the precursor of the inorganic material. The polysilazane is oxidized by being irradiated with an energy ray such as excimer UV light, is thereby ceramized (subjected to silica reforming or modification) and forms silica, SiN or SiON. Note that the "polysilazane" is a polymer having a silicon-nitrogen bond, is an inorganic polymer comprising Si—N, Si—H, N—H, or the like, and is a precursor of a ceramics such as $SiO_2$, $Si_3N_4$, or $SiO_xN_y$, which is an intermediate solid solution of such a ceramics. A compound, which is ceramized at relatively low temperature and is modified into silica, as that represented by the following general formula (1) described in Japanese Patent Application Laid-open No. H08-112879, is more preferable.

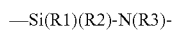   General formula (1):

In the general formula (1), R1, R2, and R3 each represent a hydrogen atom, an alkyl group, an alkenyl group, a cycloalkyl group, an aryl group, an alkylsilyl group, an alkylamino group, or an alkoxy group.

Among the compounds represented by the general formula (1), perhydropolysilazane (referred to also as PHPS) in which all of R1, R2, and R3 are hydrogen atoms and organopolysilazane in which a part of the hydrogen bonded to Si thereof is substituted by, for example, an alkyl group are particularly preferred.

Other examples of the polysilazane ceramized at low temperature which are usable include: silicon alkoxide-added polysilazane obtained by reacting polysilazane with silicon alkoxide (see, for example, Japanese Patent Laid-Open No. H05-238827); glycidol-added polysilazane obtained by reaction with glycidol (see, for example, Japanese Patent Laid-open No. H06-122852); alcohol-added polysilazane obtained by reaction with alcohol (see, for example, Japanese Patent Laid-open No. H06-240208); metal carboxylate-added polysilazane obtained by reaction with metal carboxylate (see, for example, Japanese Patent Laid-Open No. H06-299118); acetylacetonato complex-added polysilazane obtained by reaction with an acetylacetonato complex containing a metal (see, for example, Japanese Patent Laid-Open No. H06-306329); metallic fine particles-added polysilazane obtained by adding metallic fine particles (see, for example, Japanese Patent Laid-Open No. H07-196986), and the like.

As the solvent of the polysilazane solution, it is possible to use hydrocarbon solvents such as aliphatic hydrocarbons, alicyclic hydrocarbons, and aromatic hydrocarbons; halogenated hydrocarbon solvents; and ethers such as aliphatic ethers and alicyclic ethers. Amine or a metal catalyst may be added in order to promote the modification into a silicon oxide compound.

Note that a dispersion liquid of fine particles of an inorganic material may be used, instead of using the above-described precursor solution of the inorganic material. Further, it is allowable to form the concave-convex structure layer by a liquid phase deposition (LPD) method, etc. In the present application, "a layer obtained from the precursor solution" means a layer formed by curing a film formed by application of the precursor solution by means of polycondensation reaction, oxidation reaction, drying, etc.; and the layer obtained from the precursor solution encompasses a layer formed by the application of the dispersion liquid of the fine particles of the inorganic material and then by the drying, and a layer formed by the liquid phase deposition method, as well.

<Coating Step>

The precursor solution of the inorganic material prepared as described above is applied onto the gas barrier layer (the gas barrier layer is coated with the precursor solution of the inorganic material). It is allowable to perform a surface treatment such as the plasma treatment, the corona treatment, etc., for, or provide an easy-adhesion layer on, the gas barrier layer in order to improve the adhesion property. As the coating method for coating the gas barrier layer with the precursor solution, it is possible to use any coating method including, for example, a bar coating method, a spin coating method, a spray coating method, a dip coating method, a die coating method, and an ink-jet method. The bar coating method, the die coating method, and the spin coating method are preferable, because the base member having a relatively large area can be coated uniformly with the precursor solution and the coating can be quickly completed prior to curing (gelation) of a precursor film obtained by the application of the precursor solution.

After the coating of the gas barrier layer with the precursor solution, the base member may be kept (held) in the atmospheric air or under reduced pressure in order to evaporate the solvent contained in the coating film (precursor film). In a case that the holding time of the base member is short, the viscosity of the coating film is too low to transfer the concave-convex pattern to the coating film. On the other hand, in a case that the holding time of the base member is too long, the polymerization reaction of the precursor proceeds and the viscosity of the coating film becomes too high, which in turn makes it impossible to transfer the concave-convex pattern to the coating film. Further, after the coating of the gas barrier layer with the precursor solution, the gelation of the coating film proceeds as the evaporation of the solvent proceeds, and the physical property such as the viscosity of the coating film also changes in a short time. From the viewpoint of the stability of concave-convex pattern formation, it is preferred that drying time which enables a good pattern transfer has a sufficiently wide range. The range of the drying time which enables a good pattern transfer can be adjusted by the drying temperature (holding temperature), the drying pressure, the kind of precursor, the ratio of mixture of the material species of the precursor, the solvent amount used at the time of preparation of the precursor solution (concentration of precursor), etc. Note that in the drying step, since the solvent in the coating film (precursor film) is evaporated only by holding the base member as it is, any active drying operation such as heating and/or blowing is not necessarily required; rather, for drying the coating film, it is only required to leave the base member having the coating film formed thereon as it is for a predetermined time or to transport the base member for a predetermined time period so as to perform subsequent steps. Namely, the drying step is not indispensable in the method for producing the film member of the embodiment.

<Transfer Step>

Figure 3:
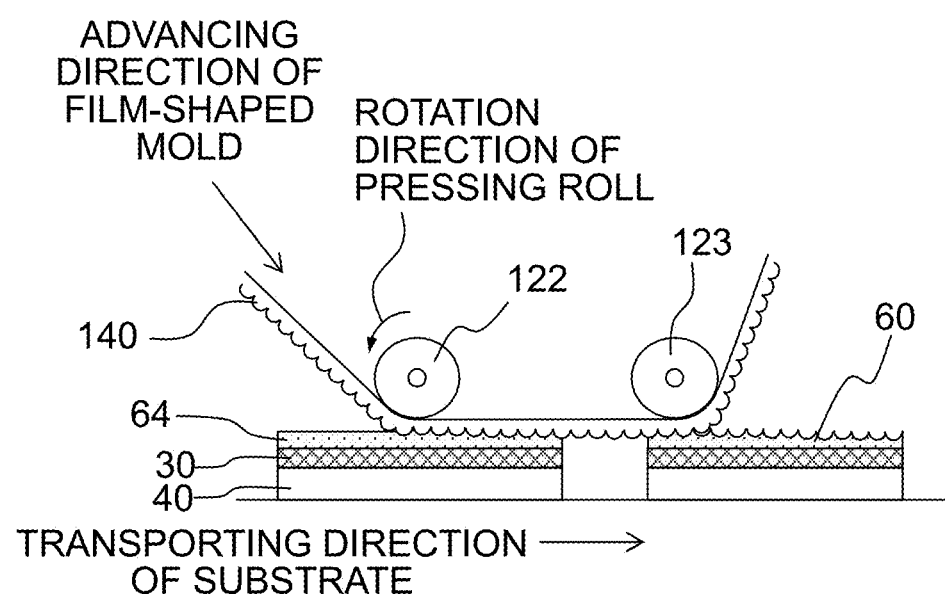
FIG. 3 is a view conceptually depicting an example of a situation in a transfer step in a method for producing the film member of the embodiment.

Next, a mold for concave-convex pattern transfer is used to transfer the concave-convex pattern of the mold to the coating film (precursor film). A film-shaped mold or metal mold, which can be produced by a method to be described later on, can be used as the mold, and it is preferred that a flexible film-shaped mold be used as the mold. In this situation, a pressing roll may be used to press the mold against the precursor film. The roll process using the pressing roll has the following advantages over the pressing system. Namely, for example, the period of time during which the mold and the coating film are brought in contact with each other is short, and hence it is possible to prevent any deformation or collapse of pattern which would be otherwise caused by the difference in thermal expansion coefficient among the mold, the base member, and a stage on which the base member is placed, etc.; it is possible to prevent the generation of bubbles of gas in the pattern due to the bumping of the solvent in the precursor film or to prevent any trace or mark of gas from remaining; it is possible to reduce the transfer pressure and the releasing force (peeling force) owing to the line contact with the base member (coating film), thereby making it possible to easily handle a base member with larger area; and no bubble is included during the pressing. Further, the base member may be heated while the mold is being pressed thereto. FIG. 3 depicts an example in which the mold is pressed against the coating film (precursor film) by using the pressing roll. As depicted in FIG. 3, the concave-convex pattern of a film-shaped mold 140 can be transferred to a coating film 64 on the base member 40 by sending the film-shaped mold 140 between a pressing roll 122 and the base member 40 being transported immediately below the pressing roll 122. Namely, when the film-shaped mold 140 is pressed against the coating film 64 with the pressing roll 122, the surface of the coating film 64 on the base member 40 is coated (covered) with the film-shaped mold 140 while the film-shaped mold 140 and the base member 40 are synchronously transported. In this situation, by rotating the pressing roll 122 while pressing the pressing roll 122 against the back surface (surface on the side opposite to the surface in which the concave-convex pattern is formed) of the film-shaped mold 140, the film-shaped mold 140 moves with the base member 40 while being brought into tight contact with the base member 40. In order to send the long film-shaped mold 140 to the pressing roll 122, such a configuration is conveniently used wherein the film-shaped mold 140 is fed directly from a film roll around which the long film-shaped mold 140 is wound.

After the mold 140 is pressed against the precursor film, the precursor film may be subjected to pre-baking. The pre-baking converts the precursor film into an inorganic material and cures the coating film, thereby solidifying the concave-convex pattern, which in turn allows the concave-convex pattern to be less likely to be collapsed during releasing or peeling of the mold 140. In a case that the pre-baking is performed, heating is preferably performed at a temperature in a range of the room temperature to 300° C. in the atmosphere. Note that, however, it is not necessarily required to perform the pre-baking. On the other hand, in a case that the material generating an acid or alkali by being irradiated with a light such as ultraviolet ray is added to the precursor solution, it is allowable for example to irradiate the precursor film with the energy ray represented by ultraviolet ray including the excimer UV light, rather than performing the pre-baking for the precursor film, so as to cure the coating film.

After the pressing with the mold or the pre-baking for the precursor film, the mold is released or peeled off from the coating film (precursor film, or an inorganic material film formed by converting the precursor film into the inorganic material). As the method for releasing the mold, any publicly known releasing method can be adopted. Convexities and concavities of the concave-convex pattern of the mold used in the producing method of the embodiment have an elongated shape, and a waveform structure in which inclination is gentle, thereby providing satisfactory releasing property (releasability or peeling property). Further, since the inorganic material obtained by converting the precursor is made of the material same as that forming the surface of the gas barrier layer, the coating film is firmly attached to the gas barrier layer. Accordingly, the coating film is not peeled off or removed from the gas barrier layer while the coating film is maintaining the tight contact with the mold. The mold may be released while the coating film being heated. By doing so, gas generated from the coating film is allowed to escape, thereby preventing any generation of bubbles in the coating film. In a case that the roll process is used, the releasing force (peeling force) may be smaller than that in the pressing system using a plate-shaped mold, and it is possible to easily release the mold from the coating film without allowing the coating film to remain on the mold. In particular, since the pressing is performed while the coating film is being heated, the reaction progresses more easily, which in turn facilitates the releasing of the mold from the coating film immediately after the pressing. In order to improve the releasing property (peeling property) of the mold, it is possible to use a peeling roll (releasing roll). As depicted in FIG. 3, a peeling roll (releasing roll) 123 is disposed on the downstream side of the pressing roll 122, and the peeling roll 123 rotates and supports the film-shaped mold 140 while urging the film-shaped mold 140 toward the coating film 64. With this configuration, it is possible to maintain a state that the film-shaped mold 140 is attached to the coating film 64 as long as a distance between the pressing roll 122 and the peeling roll 123 (for a certain period of time). Then, a path of the film-shaped mold 140 is changed so that the film-shaped mold 140 is pulled up above the peeling roll 123 on the downstream side of the peeling roll 123, thereby peeling off (releasing) the film-shaped mold 140 from the coating film in which concavities and convexities are formed (concave-convex structure layer 60). The pre-baking or the heating for the coating film 64 may be performed during a period in which the film-shaped mold 140 is attached to the coating film 64. Note that in a case of using the peeling roll 123, the releasing of the mold 140 becomes easier by releasing the mold 140 from the coating film while heating the coating film 64, for example, at a temperature in a range of the room temperature to 300° C. in the atmosphere.

<Curing Step>

After the mold is released from the coating film formed with the concavities and convexities (concave-convex structure layer), the concave-convex structure layer may be cured (subjected to main curing or baking). In the embodiment, the concave-convex structure layer can be cured by performing main baking therefor. In a case of using a precursor which is converted into silica by the sol-gel method, the hydroxyl group or the like contained in silica (amorphous silica) constructing the concave-convex structure layer is desorbed or eliminated (subjected to the leaving) by the main baking, and the concave-convex structure layer is further hardened or solidified. The main baking is preferably performed at a temperature in a range of 200° C. to 1200° C. for a duration of time in a range of about 5 minutes to about 6 hours. In this situation, in a case that the concave-convex structure layer is made of silica, silica is amorphous, crystalline, or in a mixture state of the amorphous and the crystalline, depending on the baking temperature and the baking time. Note that it is not necessarily indispensable that the curing step is performed. Further, in a case that a material, which generates an acid or alkali by being irradiated with a light such as ultraviolet ray, is added to the precursor solution, the concave-convex structure layer can be subjected to the main curing by being irradiated with an energy ray represented by ultraviolet ray including the excimer UV light, rather than baking the concave-convex structure layer.

In the above-described manner, it is possible to produce a film member 100 in which the gas barrier layer 30 and the concave-convex structure layer 60 are formed on the film member 40, as depicted in FIG. 1.

Note that as the precursor with which the coating is performed in the coating step as described above, it is allowable to use a precursor such as $TiO_2$, ZnO, ZnS, $ZrO_2$, $Al_2O_3$, $BaTiO_3$, $SrTiO_2$, ITO, etc., other than the silica precursor. It is preferred to use a precursor of an inorganic material which is same as the inorganic material forming (constructing) the uppermost surface (a surface making contact with the concave-convex structure layer) 30a of the gas barrier layer.

The material for forming the concave-convex structure layer may be a material obtained by mixing the above-described precursor with an ultraviolet absorbent material. The ultraviolet absorbent material has the function or effect to prevent deterioration of the film by absorbing ultraviolet rays and converting the light energy into something harmless such as heat. Any publicly known agent may be used as the ultraviolet absorbent material. Those usable as the ultraviolet absorbent material include, for example, benzotriazole-based absorbents, triazine-based absorbents, salicylic acid derivative-based absorbents, benzophenone-based absorbents, etc.

A covering layer (coating layer) may be formed on the surface of the concave-convex structure layer. It is preferred that the thickness of the covering layer be in a range of 25% to 150% of the standard deviation of depth of concavities and convexities of the concave-convex structure layer. Such a covering layer can cover any foreign matter and/or defect which might be present on the surface of the concave-convex structure layer. Thus, in a case that a light emitting element such as an organic EL element is formed by using this film member, it is possible to effectively prevent any leak current in the light emitting element. Further, a light emitting element, which is formed by using the film member provided with the covering layer having a thickness within the above range, has good light extraction efficiency.

As the material of the covering layer (covering material (coating material)), it is possible to use: sol-gel materials which are exemplified above as being usable as the material for the concave-convex structure layer and including: $SiO_x$, $TiO_2$, ZnO, $ZrO_2$, $Al_2O_3$, ZnS, $BaTiO_3$, $SrTiO_2$, ITO (in-dium-tin oxide), etc.; materials obtained by allowing any one of these sol-gel materials to contain publicly known fine particles, filler, ultraviolet absorbent material, etc. In particular, it is preferred that the covering layer is formed by using a material that is same as the material used as the material for the concave-convex structure layer. By forming the covering layer of a material same as the material of the concave-convex structure layer, it is possible to suppress the reflection of light at an interface between the covering layer and the concave-convex structure layer. As a solution of the sol-gel material (sol-gel material solution) used for forming for the covering layer, it is preferred to use a material obtained by further diluting, with a solvent, the sol-gel material solution used for forming the concave-convex structure layer. With this, the covering layer can be easily formed to have a predetermined film thickness (thickness) which is thinner than the concave-convex structure layer.

Further, other than using the sol-gel method, it is allowable to form the covering layer by using, for example, a method using a dispersion liquid of fine particles of the inorganic material, the liquid phase deposition (LPD), etc.

Alternatively, polysilazane may be used to form the covering layer. In this case, it is also allowable to form the covering layer by performing the application and transfer using the polysilazane, and to cure and thereby ceramicize (perform silica reforming or modification for) the formed covering layer so as to obtain a covering layer made of silica, SiN or SiON. Note that the "polysilazane" is a polymer having a silicon-nitrogen bond, is an inorganic polymer comprising Si—N, Si—H, N—H, or the like, and is a precursor of a ceramics such as $SiO_2$, $Si_3N_4$, or $SiO_xN_y$, which is an intermediate solid solution of such a ceramics. A compound, which is ceramized at relatively low temperature and is modified into silica, as that represented by the following general formula (1) described in Japanese Patent Application Laid-open No. H08-112879, is more preferable.

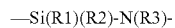

—Si(R1)(R2)-N(R3)-   General Formula (1):

In the general formula (1), R1, R2, and R3 each represent a hydrogen atom, an alkyl group, an alkenyl group, a cycloalkyl group, an aryl group, an alkylsilyl group, an alkylamino group, or an alkoxy group.

Among the compounds represented by the general formula (1), perhydropolysilazane (referred to also as PHPS) in which all of R1, R2, and R3 are hydrogen atoms, and organopolysilazane in which a part of the hydrogen bonded to Si thereof is substituted by, for example, an alkyl group are particularly preferred.

Other examples of the polysilazane ceramized at low temperature which are usable include: silicon alkoxide-added polysilazane obtained by reacting polysilazane with silicon alkoxide (see, for example, Japanese Patent Laid-Open No. H05-238827); glycidol-added polysilazane obtained by reaction with glycidol (see, for example, Japanese Patent Laid-open No. H06-122852); alcohol-added polysilazane obtained by reaction with alcohol (see, for example, Japanese Patent Laid-open No. H06-240208); metal carboxylate-added polysilazane obtained by reaction with metal carboxylate (see, for example, Japanese Patent Laid-Open No. H06-299118); acetylacetonato complex-added polysilazane obtained by reaction with an acetylacetonato complex containing a metal (see, for example, Japanese Patent Laid-Open No. H06-306329); metallic fine particles-added polysilazane obtained by adding metallic fine particles (see, for example, Japanese Patent Laid-Open No. H07-196986), and the like.

As the solvent of the polysilazane solution, it is possible to use hydrocarbon solvents such as aliphatic hydrocarbons, alicyclic hydrocarbons, and aromatic hydrocarbons; halogenated hydrocarbon solvents; and ethers such as aliphatic ethers and alicyclic ethers. Amine or a metal catalyst may be added in order to promote the modification into a silicon oxide compound.

The curing of polysilazane may be promoted by heating, or by irradiation with an energy ray such as excimer UV light, etc.

Further, it is allowable to use, as the material for the covering layer, a curable resin material (curable resin), other than the above-described inorganic material. In such a case of forming the covering layer with the curable resin, for example, the covering layer may be formed by applying the curable resin onto the concave-convex structure layer, and then by curing the applied curable resin. The curable resin may be applied after being diluted with an organic solvent. As the organic solvent used in this case, an organic solvent, which can dissolve the resin before being cured, can be selected and used. For example, it is possible to select the organic solvent from among publicly known organic solvents including, for example, alcohol-based solvents such as methanol, ethanol, and isopropyl alcohol (IPA); and ketone-based solvents such as acetone, methyl ethyl ketone, and methyl isobutyl ketone (MIBK). As the method for applying the curable resin, for example, it is possible to adopt various coating methods such as the spin coating method, spray coating method, dip coating method, dropping method, gravure printing method, screen printing method, relief printing method, die coating method, curtain coating method, ink-jet method, sputtering method, etc. The condition for curing the curable resin depends on the kind of the resin to be used. For example, the curing temperature is preferably in a range of room temperature to 250° C., and the curing time is preferably in a range of 0.5 minute to 3 hours. Alternatively, a method may be employed in which the curable resin is cured by being irradiated with an energy ray such as ultraviolet light or electron beam. In such a case, the amount of the irradiation is preferably in a range of 20 mJ/cm$^2$ to 5 J/cm$^2$.

Further, a hydrophobization treatment may be performed on the surface of the concave-convex structure layer (the surface of the covering layer in a case that the covering layer is formed). Any known method for the hydrophobization treatment may be used. For example, regarding the surface of silica, the hydrophobization treatment can be performed with dimethyl dichlorosilane, trimethyl alkoxysilan, etc., or with a silicone oil and a trimethylsilylating agent such as hexamethyl-disilazane. Alternatively, it is also allowable to employ a surface treatment method for a surface of metal oxide powder with supercritical carbon dioxide. By allowing the surface of the concave-convex structure layer to have the hydrophobicity, it is possible to easily remove moisture from the substrate during a manufacturing process of an optical element such as organic EL element using the film member of the embodiment, thereby making it possible to prevent, in the optical element, any generation of defect, such as a dark spot, and any deterioration of the device.

<Mold for Concave-Convex Pattern Transfer>

Examples of a mold for concave-convex pattern transfer used for producing a film member having the concave-convex structure of the embodiment include, for example, a metal mold or a film-shaped resin mold produced in a method as will be described later on. The resin forming the resin mold also includes rubber such as natural rubber or synthetic rubber. The mold has a concave-convex pattern (convexity and concavity pattern) on a surface thereof.

An explanation will be given about an exemplary method for producing the mold for concave-convex pattern transfer. A master block pattern for forming the concave-convex pattern of the mold is produced first. For example, in a case that a film member having a concave-convex pattern composed of curved line-shaped convexities and concavities extending in non-uniform directions, it is suitable that the master block is formed by a method of utilizing the self-organization or self-assembly (micro phase separation) of a block copolymer by heating, as described in International Publication No. WO2012/096368 of the applicants of the present invention (hereinafter referred to as "BCP (Block Copolymer) thermal annealing method" as appropriate), or a method of utilizing the self-organization or self-assembly of a block copolymer under a solvent atmosphere, as described in International Publication No. WO2013/161454 of the applicants of the present invention (hereinafter referred to as "BCP solvent annealing method" as appropriate), or a method of heating and cooling a vapor deposited film on a polymer film to form concavities and convexities of wrinkles on a surface of polymer, as disclosed in International Publication No. WO2011/007878 A1 of the applicants of the present invention (hereinafter referred to as "BKL (Buckling) method" as appropriate). In a case that the pattern is formed by the BCP thermal annealing method or the BCP solvent annealing method, although any material can be used as the material for forming the pattern, the material is preferably a block copolymer composed of a combination of two selected from the group consisting of: a styrene-based polymer such as polystyrene; polyalkyl methacrylate such as polymethyl methacrylate; polyethylene oxide; polybutadiene; polyisoprene; polyvinylpyridine; and polylactic acid. The pattern formed by the self-organization of these materials preferably has a horizontal cylinder structure (structure wherein cylinders are oriented horizontally relative to a base material) as described in WO2013/161454, or a vertical lamella structure (structure in which lamellae are oriented vertically relative to a base material) as described in "Macromolecules" 2014, Vol. 47, pp. 2, among which the vertical lamella structure is more preferred for a case of forming deeper concavities and convexities. Further, the concave-convex pattern obtained by the solvent annealing process may be subjected to etching by irradiation with energy rays represented by ultraviolet rays such as excimer UV light, or etching by a dry etching method such as RIE (reactive ion etching), etc. Furthermore, the concave-convex pattern which has been subjected to such an etching may be subjected to the heating process. Moreover, based on the concave-convex pattern formed by the BCP thermal annealing method or the BCP solvent annealing method, it is possible to form a concave-convex pattern in which concavities and convexities have further deeper depth, with a method as described in "Advanced Materials" 2012, vol. 24, pp. 5688-5694, "Science", vol. 322, pp. 429 (2008), etc. Namely, a base material layer formed of SiO$_2$, Si, etc. is coated with a block copolymer, and a self-organization structure of the block copolymer is formed by the BCP thermal annealing method or the BCP solvent annealing method. Then, one of the segments of the block copolymer is selectively etched away. The other segment, as the remaining segment, is used as a mask to perform etching for the base material layer, thereby forming a groove (concavity or concave portion) having a desired depth in the base material layer.

Instead of using the above-described BCP thermal annealing method, the BKL method and the BCP solvent annealing method, the photolithography method may be used to form the concave-convex pattern. Other than these, the concave-convex pattern of the master block can be produced, for example, also by microfabrication or fine-processing methods including a cutting (cutting and processing) or machining method, an electron-beam direct imaging method, a particle beam processing method, a scanning probe processing method, and a fine-processing method using the self-organization or self-assembly of fine particles, etc. In a case of manufacturing a film member having a concave-convex pattern composed of linear or curved-shaped convexities and concavities extending in a uniform direction, it is allowable to form a master block having the concave-convex pattern composed of the linear or curved-shaped convexities and concavities extending in the uniform direction, with the these methods.

After forming the master block with the concave-convex pattern by means of the BCP thermal annealing method, the BKL method or the BCP solvent annealing method, etc., further, a mold to which the pattern is transferred can be formed by an electroforming method or the like, as follows. At first, a seed layer functioning as an electroconductive layer for an electroforming process can be formed on the master block, which has the pattern thereon, by means of non-electrolytic plating, sputtering, vapor deposition, or the like. The thickness of the seed layer is preferably not less than 10 nm to uniformize a current density during the subsequent electroforming process, and thereby making the thickness of a metal layer accumulated by the subsequent electroforming process be uniform. As the material of the seed layer, it is possible to use, for example, nickel, copper, gold, silver, platinum, titanium, cobalt, tin, zinc, chrome, gold-cobalt alloy, gold-nickel alloy, boron-nickel alloy, solder, copper-nickel-chromium alloy, tin-nickel alloy, nickel-palladium alloy, nickel-cobalt-phosphorus alloy, or alloy thereof. Subsequently, a metal layer is accumulated on the seed layer by the electroforming (electroplating). The entire thickness of the metal layer including the thickness of the seed layer can be, for example, in a range of 10 µm to 30000 µm. As the material of the metal layer accumulated by the electroforming, it is possible to use any of the metal species as described above which can be used as the seed layer. Considering ease of the subsequent processes for forming the mold such as pressing with respect to the resin layer, releasing (peeling-off), and cleaning (washing), the formed metal layer desirably has appropriate hardness and thickness.

The metal layer including the seed layer obtained as described above is released (peeled off) from the master block having the concave-convex structure to obtain a metal substrate. As the releasing method, the metal layer may be peeled off physically, or the materials composing the pattern of the master block may be dissolved to be removed by using an organic solvent dissolving them, such as toluene, tetrahydrofuran (THF), and chloroform. When the metal substrate is peeled off from the master block, a remaining material component on the metal substrate can be removed by cleaning. As the cleaning method, it is possible to use wet cleaning using a surfactant etc., or dry cleaning using ultraviolet rays and/or plasma. Alternatively, for example, it is allowable to use an adhesive agent or a bonding agent such that the remaining material component is caused to attach or adhere to the adhesive agent or the bonding agent then is removed. Accordingly, the metal substrate (metal mold) which can be obtained in such a manner and to which the pattern has been transferred from the master block may be used as the mold for concave-convex pattern transfer of the embodiment.

Further, a flexible mold such as a film-shaped mold can be produced by using the obtained metal substrate and by transferring the concave-convex structure (pattern) of the obtained metal substrate to a film-shaped supporting substrate. For example, after a curable resin is applied on the supporting substrate (the supporting substrate is coated with the curable resin) to form a resin layer, the resin layer is cured while the concave-convex structure of the metal substrate is being pressed against the resin layer. The supporting substrate is exemplified, for example, by base members made of inorganic materials such as glass, quartz (quartz glass), silicon, etc.; base members made of organic materials such as silicone resin, polyethylene terephthalate (PET), polyethylene naphthalate (PEN), polycarbonate (PC), cycloolefin polymer (COP), polymethyl methacrylate (PMMA), polystyrene (PS), polyimide (PI), polyarylate, etc.; and metallic materials such as nickel, copper, aluminum, etc. The thickness of the supporting substrate may be in a range of 1 µm to 500 µm.

The curable resin can be exemplified by various resins including, for example, monomers, oligomers, and polymers of those based on epoxy, acryl, methacryl, vinyl ether, oxetane, urethane, melamine, urea, polyester, polyolefin, phenol, cross-linking type liquid crystal, fluorine, silicone, polyamide, etc. The thickness of the curable resin is preferably in a range of 0.5 µm to 500 µm. In a case that the thickness is less than the lower limit, heights of the concavities and convexities formed on the surface of the cured resin layer are likely to be insufficient. On the other hand, in a case that the thickness exceeds the upper limit, the influence of volume change of the resin upon curing is likely to be so large that there is such a possibility that the formation of the shape of the concavities and convexities might be unsatisfactory.

As a method for coating the supporting substrate with the curable resin, it is possible to adopt, for example, various coating methods such as the spin coating method, spray coating method, dip coating method, dropping method, gravure printing method, screen printing method, relief printing method, die coating method, curtain coating method, ink-jet method, and sputtering method. Further, although the condition for curing the curable resin varies depending on the kind of the resin to be used, the curing temperature is preferably for example in a range of the room temperature to 250° C., and the curing time is preferably in a range of 0.5 minute to 3 hours. Alternatively, a method may be employed in which the curable resin is cured by being irradiated with energy ray such as ultraviolet light or electron beam. In such a case, the amount of the irradiation is preferably in a range of 20 mJ/cm$^2$ to 5 J/cm$^2$.

Subsequently, the metal substrate is detached from the curable resin layer after the curing. The method for detaching the metal substrate is not limited to a mechanical releasing (exfoliating or peeling off) method, and a publicly known method can be adopted. Accordingly, a film-shaped resin mold, which can be obtained in such a manner and which has the cured resin layer having the concavities and convexities and formed on the supporting substrate, may be used as the mold for concave-convex pattern transfer of the embodiment.

Further, it is possible to coat the concave-convex structure (pattern) of the metal substrate obtained in the above-described manner with a rubber-based resin material, to cure the coated resin material, and to release the cured resin material from the metal substrate, so as to manufacture a rubber mold having the concave-convex pattern of the metal substrate transferred thereto. The obtained rubber mold may be used as the mold for concave-convex pattern transfer of the embodiment. Silicone rubber or a mixture or copolymer of silicone rubber and another material is particularly preferably used as the rubber-based resin material. The usable silicone rubber is exemplified, for example, by polyorganosiloxane, cross-linking type polyorganosiloxane, a polyorganosiloxane/polycarbonate copolymer, a polyorganosiloxane/polyphenylene copolymer, a polyorganosiloxane/polystyrene copolymer, polytrimethyl-silylpropyne, poly-4-methyl pentene, etc. The silicone rubber is more inexpensive than other resin materials; has superior heat resistance, high heat conductivity, and elasticity; and the silicone rubber is less likely to be deformed under a high temperature condition. Thus, the silicone rubber is suitable for the transfer process for concave-convex pattern under the high temperature condition. Further, since the silicone rubber-based material has high permeability of gas and water vapor, a solvent and water vapor of a material to be subjected to transfer can go through or permeate the silicone rubber material easily. Therefore, the silicone rubber-based material is suitable for such a case of using the rubber mold for the purpose of transferring the concave-convex pattern to a film of the precursor of the inorganic material as described above. Further, it is preferred that the surface free energy of rubber-based material be not more than 25 mN/m. With this, it is possible to obtain a superior mold-releasing property during the transfer of the concave-convex pattern of the rubber mold to the coating film on the base member, thereby making it possible to prevent any transfer failure. The rubber mold may have, for example, a length in a range of 50 mm to 1000 mm, a width in a range of 50 mm to 3000 mm, and a thickness in a range of 1 mm to 50 mm. Further, a mold-release treatment may be performed on the surface of the concave-convex pattern of the rubber mold as needed.

[Light Emitting Element]

Next, an explanation will be given about an embodiment of a light emitting element produced by using a substrate having the concave-convex structure of the above-described embodiment. As depicted respectively in FIGS. 4A and 4C, light emitting elements 200, 200a and 200b, of the embodiment, each include a first electrode 92, an organic layer 94 and a second electrode 98 in this order on a film member 100 having a concave-convex structure (concave-convex pattern) 80 and formed of a base member 40, a gas barrier layer 30 and a concave-convex structure layer 60.

<First Electrode>

The first electrode 92 may be a transparent electrode so that the light from the organic layer 94 formed on the first electrode 92 passes toward the base member 40. It is preferred that the first electrode 92 be stacked such that the surface of the first electrode 92 maintains or shows the concave-convex structure (concave-convex pattern) 80 formed in the surface of the concave-convex structure layer 60. Note that the arrangement and the shape of the first electrode 92 in the XY direction are not particularly limited.

Those usable as the material of the first electrode 92 include, for example, indium oxide, zinc oxide, tin oxide, indium-tin oxide (ITO) which is a composite material thereof, gold, platinum, silver, and copper. Among these materials, ITO is preferable from the viewpoint of transparency and electrical conductivity. The thickness of the first electrode 92 is preferably within a range of 20 nm to 500 nm.

<Organic Layer>

The organic layer 94 is formed on the first electrode 92. The organic layer 94 is not particularly limited, provided that the organic layer 94 is usable as an organic layer of the organic EL element. As the organic layer 94, any publicly known organic layer can be used as appropriate.

Figure 4A:
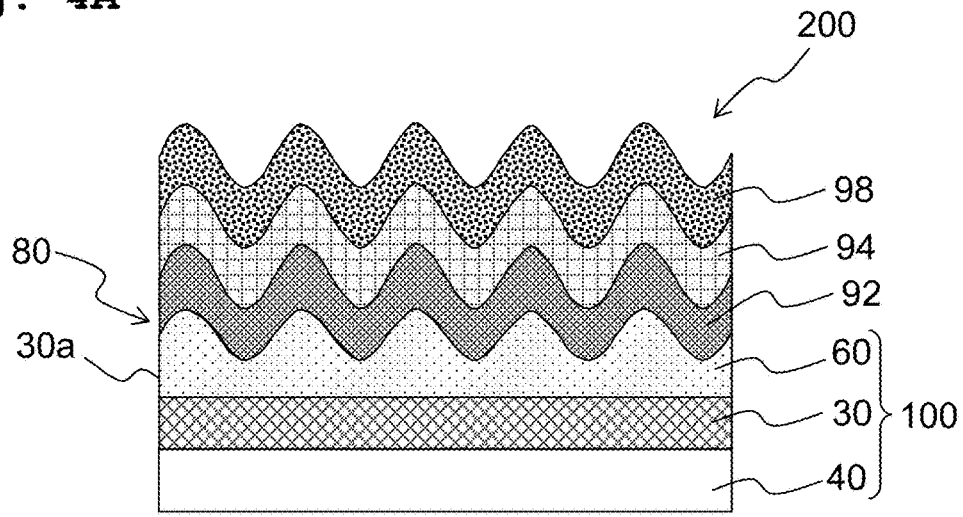
Figure 4B:
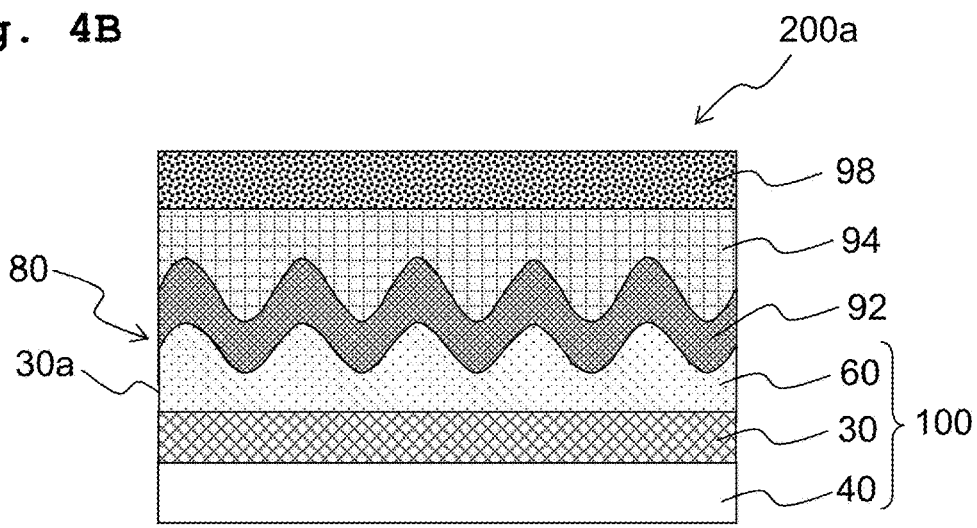

The surface of the organic layer 94 (interface between the organic layer 94 and the second electrode 98) may maintain the shape of the concave-convex pattern 80 formed in the surface of the concave-convex structure layer 60, as depicted in FIG. 4A. Alternatively, the surface of the organic layer 94 may be flat without maintaining the shape of the concave-convex pattern 80 formed in the surface of the concave-convex structure layer 60, as depicted in FIG. 4B. In a case that the surface of the organic layer 94 maintains the shape of the concave-convex pattern 80 formed in the surface of the concave-convex structure layer 60, the plasmon absorption by the second electrode 98 is reduced, thus improving the light extraction efficiency. Here, those usable as the material of the hole transporting layer include, for example, aromatic diamine compounds such as phthalocyanine derivatives, naphthalocyanine derivatives, porphyrin derivatives, N,N'-bis(3-methylphenyl)-(1,1'-biphenyl)-4,4'-diamine (TPD), and 4,4'-bis[N-(naphthyl)-N-phenyl-amino]biphenyl($\alpha$-NPD); oxazole; oxadiazole; triazole; imidazole; imidazolone; stilbene derivatives; pyrazoline derivatives; tetrahydroimidazole; polyarylalkane; butadiene; and 4,4',4"-tris(N-(3-methylphenyl)N-phenylamino)triphenylamine (m-MTDATA). The examples of materials of the hole transporting layer, however, are not limited to the above-described materials. The light emitting layer is provided in order that a hole injected from the first electrode 92 and an electron injected from the second electrode 98 are recombined to occur light emission. Those usable as the material of the light emitting layer include, for example, metallo-organic complex such as anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, and aluminum-quinolinol complex (Alq3); tri-(p-terphenyl-4-yl)amine; 1-aryl-2,5-di(2-thienyl) pyrrole derivatives; pyran; quinacridone; rubren; distyrylbenzene derivatives; distyryl arylene derivatives; distyryl amine derivatives; and various fluorescent pigments or dyes. Further, it is also preferred that light-emitting materials selected from the above compounds be mixed as appropriate and then used. Furthermore, it is possible to preferably use a material system generating emission of light from a spin multiplet, such as a phosphorescence emitting material generating emission of phosphorescence and a compound including, in a part of the molecules, a constituent portion formed by the above materials. The phosphorescence emitting material preferably includes heavy metal such as iridium. A host material having high carrier mobility may be doped with each of the light-emitting materials as a guest material to generate the light emission using dipole-dipole interaction (Forster mechanism) or electron exchange interaction (Dexter mechanism). Those usable as the material of the electron transporting layer include, for example, heterocyclic tetracarboxylic anhydrides such as nitro-substituted fluorene derivatives, diphenylquinone derivatives, thiopyran dioxide derivatives, and naphthaleneperylene; and metallo-organic complex such as carbodiimide, fluorenylidene methane derivatives, anthraquino dimethane and anthrone derivatives, oxadiazole derivatives, and aluminum-quinolinol complex (Alq3). Further, in the oxadiazole derivatives mentioned above, it is also possible to use, as an electron transporting material, thiadiazole derivatives in which oxygen atoms of oxadiazole rings are substituted by sulfur atoms, and quinoxaline derivatives having quinoxaline rings known as electron attractive group. Furthermore, it is also possible to use a polymeric material in which the above materials are introduced into a macromolecular chain or the above materials are made to be a main chain of the macromolecule. Note that the hole transporting layer or the electron transporting layer may also function as the light-emitting layer.

Further, from the viewpoint of facilitating the electron injection from the second electrode 98, a layer made of a metal fluoride or metal oxide such as lithium fluoride (LiF) or $Li_2O_3$, a highly active alkaline earth metal such as Ca, Ba, or Cs, an organic insulating material, or the like may be provided as an electron injection layer between the organic layer 94 and the second electrode 98. Furthermore, from the viewpoint of facilitating the hole injection from the first electrode 92, it is allowable to provide, as a hole injection layer between the organic layer 94 and the first electrode 92, a layer made of triazol derivatives, oxadiazole derivative, imidazole derivative, polyarylalkane derivatives, pyrazoline and pyrazolone derivatives, phenylenediamine derivative, arylamine derivatives, amino-substituted calcone derivatives, oxazole derivatives, styrylanthracene derivatives, fluorenone derivatives, hydrazone derivatives, stilbene derivatives, silazane derivatives, aniline-based copolymers, or electroconductive high-molecular oligomar, particularly thiophene oligomer.

Moreover, in a case that the organic layer 94 is a stacked body formed of the hole transporting layer, the light emitting layer, and the electron transporting layer, the thicknesses of the hole transporting layer, the light emitting layer, and the electron transporting layer are preferably within a range of 1 nm to 200 nm, a range of 5 nm to 100 nm, and a range of 5 nm to 200 nm, respectively.

<Second Electrode>

The second electrode 98 is formed on the organic layer 94. As the material of the second electrode 98, a substance having a small work function can be used as appropriate, although the material of the second electrode 98 is not particularly limited to this. For example, the second electrode 98 may be a metal electrode using aluminum, MgAg, MgIn, AlLi, or the like. The thickness of the second electrode 98 is preferably in a range of 50 nm to 500 nm. The second electrode 98 may be stacked such that the surface of the second electrode 98 maintains or shows the concave-convex structure (concave-convex pattern) 80 formed in the surface of the concave-convex structure layer 60.

Figure 4C:
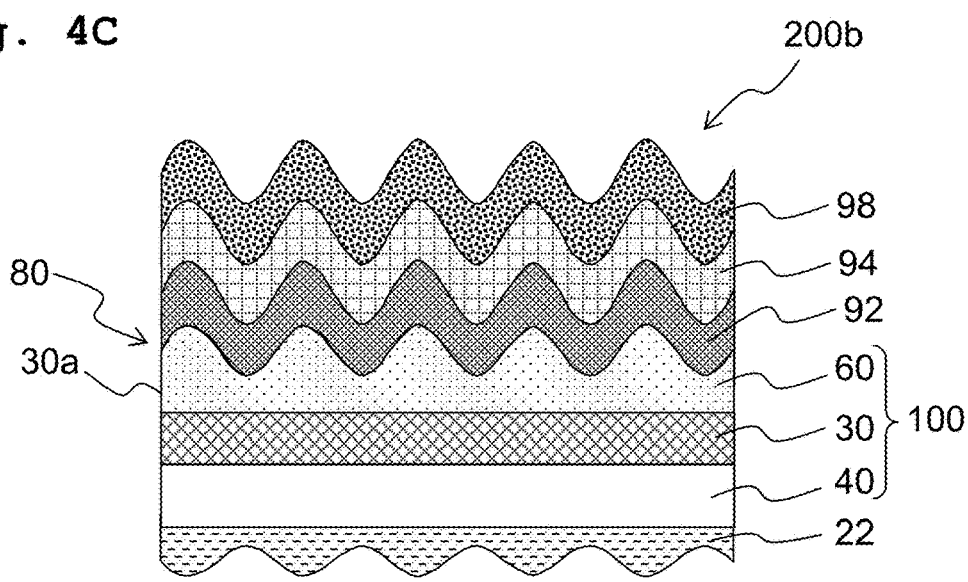

Further, as depicted in FIG. 4C, the light emitting element 200b may have an optical functional layer 22 on a surface (surface serving as a light extraction surface of the light emitting element), of the base member 40, on a side opposite to the surface thereof having the gas barrier layer 30 formed thereon. By providing such an optical functional layer 22 on the surface of the base film 40, it is possible to suppress any total reflection of a light passing through the inside of the base member 40 at the interface of the base member 40 (including the optical functional layer 22) and the air, thereby making it possible to improve the light extraction efficiency. Such an optical functional layer 22 may be exemplified by a substance usable for extracting light from the light emitting element, although the optical functional layer 22 is not particularly limited to this. It is possible to use any optical member having a structure capable of controlling the refraction of light, light condensing, light diffusion (light scattering), light diffraction, light reflection, etc., and of extracting the light to the outside of the element. As such an optical functional layer 22, it is allowable to use, for example, a variety of kinds of lens members such as a convex lens such as semicircular lens, a concave lens, a Fresnel lens, a prism lens, a columnar lens, a lenticular-typed lens, a micro lens formed of a concave-convex layer which can be formed with a method similar to the method for producing the film member having the concave-convex structure layer as described above, etc.; a diffusion sheet and a diffusion board each including a transparent body and a dispersing agent kneaded in the transparent body, a diffusion sheet and a diffusion board each having a concave-convex structure (concave-convex pattern) formed in a surface thereof; a diffraction grating, a member having an anti-reflection function; and the like. Among the above-described members or lenses, the lens member is preferred from the viewpoint of realizing more efficient light extraction. Further, as such a lens member, a plurality of lens members may be used; in such a case, fine or minute lens members are aligned to form a so-called micro lens (array). Any commercially available product may be used as the optical functional layer 22.

Note that although FIG. 4C depicts the light emitting element 200b wherein the optical functional layer 22 is provided on an outside surface of the substrate 40 of the light emitting element 200 depicted in FIG. 4A, it is also allowable to provide the optical functional layer 22 on an outside surface of the substrate 40 of the light emitting element 200b depicted in FIG. 4B.

Further, since the second electrode 98 is a metallic electrode, it is allowable to provide a polarizing plate on the second electrode 98, as a countermeasure for the mirror reflection for the second electrode 98. Furthermore, it is also allowable to seal the surrounding of each of the light emitting elements 200, 200a and 200b, with a sealing material, for the purpose of preventing any deterioration of each of the light emitting elements 200, 200a and 200b due to the moisture and/or oxygen.

Since the film member 100 used in the light emitting elements 200, 200a and 200 of the embodiment includes the gas barrier layer 30 and the concave-convex structure layer 60 which are made of the inorganic material, the film member 100 has excellent heat-resisting property, mechanical strength and chemical resistance as well. Accordingly, in the manufacturing process of the light emitting elements 200, 200a and 200b, the film member 100 is capable of sufficiently withstanding the film forming step performed in a high-temperature atmosphere, a cleaning step using $UV/O_3$ cleaning, brushing or various kinds of cleaning fluids such as acid, alkaline solvent, etc.; and a patterning step using a developer (developing solution) and/or an etchant. Further, since the gas barrier layer 30 and the concave-convex structure layer 60 are made of the inorganic material, it is possible to prevent the deterioration of the light emitting elements 200, 200a and 200b due to the moisture and/or oxygen, thereby allowing the light emitting elements 200, 200a and 200b to have a long service life. Further, since the surface 30a, of the gas barrier layer 30, which makes contact with the concave-convex structure layer 60, is made of an inorganic material same as the material of the concave-convex structure layer 60, the adhesion property between the gas barrier layer 30 and the concave-convex structure layer 60 is particularly excellent, thereby preventing the moisture and/or oxygen from leaking through the interface between the gas barrier layer 30 and the concave-convex structure layer 60, allowing the light emitting elements 200, 200a and 200b to have a further long service life. Furthermore, by using the precursor of the inorganic material for forming the concave-convex structure layer, it is possible to form the concave-convex pattern of the concave-convex structure layer by means of the roll process accurately and assuredly, thereby making it possible to manufacture the film member with a high throughput.

EXAMPLES

In the following description, the film member according to the present invention will be specifically explained with an example and comparative examples. The present invention, however, is not limited to the example and comparative examples. In Example 1 and Comparative Examples 1 and 2, film members each having a concave-convex pattern (concave-convex structure) were manufactured, respectively, and light emitting elements were manufactured by using the respective film members. Then, deterioration evaluation in a high humidity environment was conducted for each of the light emitting elements. Further, test pieces were manufactured to evaluate the adhesion property between the gas barrier layer and the concave-convex structure layer in Example 1 and Comparative Examples 1 and 2, respectively.

Example 1

[Evaluation of Adhesion Property]
<Production of Test Piece>

In order to produce a test piece to be used for the evaluation of adhesion property between the gas barrier layer and the concave-convex structure layer, a coating liquid serving as the raw material of the gas barrier layer was prepared in the following manner. Namely, 25 g of ethyl silicate, 25 g of ethanol, 1.86 g of 2N Hydrochloric Acid and 1.51 g of water were mixed to obtain a mixture thereof, and the mixture was stirred at 80° C. for 1 hour to 2 hours. In this situation, the molar ratio of the ethyl silicate to the water in the mixture was 1:1.51. 2.5 g of epoxysilane was mixed to the mixture, and was stirred. Afterwards, 17.4 g of a PVA aqueous solution of which concentration was 10% was added to the mixture, and was further stirred for 1 hour to 2 hours; at a point of time when the mixture became transparent, 0.1 g of an ethanol solution of N,N-dimethylbenzylamine of which concentration was 32% by mass was added to the mixture, was further stirred, and a coating liquid was obtained. As the base member, a PET film (Cosmoshine A-4300 manufactured by TOYOBO CO., LTD.) having a thickness of 100 µm was used, and was coated with the coating liquid by using a gravure coater at a running speed of 80 m/minute, followed by being dried at a temperature of 135° C. In this manner, a $SiO_X$ layer having a thickness of 1 µm was obtained as the gas barrier layer on the film base member.

The film base member having the gas barrier layer formed thereon was subjected to cutting out, and two pieces of a film base member having a size of 100 mm×180 mm were produced. One of the two film base members was adhered, with a kapton tape, to a glass substrate of which size was 200 mm×200 mm. The film base member was adhered to the glass substrate so that a surface, of the film base member, on the side opposite to another surface thereof having the gas barrier layer formed thereon faced (was opposite to) the glass substrate, and that the entirety of the film base member was located on the glass substrate.

In this example, since the concave-convex structure layer was formed by the sol-gel method, a solution of the precursor of the inorganic material (sol-gel material solution) was prepared by the following manner. Namely, 0.75 mol of tetraethoxysilane (TEOS) and 0.25 mol of dimethyldiethoxysilane (DMDES) were added by dropping to a liquid obtained by mixing 22 mol of ethanol, 5 mol of water, 0.004 mol of concentrated hydrochloric acid and 4 mol of acetylaceton. Further, as an additive, 0.5 wt % of a surfactant S-386 (manufacture by SEIMI CHEMICAL CO., LTD) was added, followed by being stirred for two hours at a temperature of 23° C. and a humidity of 45%, and thus a precursor of $SiO_2$ (sol-gel material solution) was obtained. The sol-gel material solution was dropped (dripped) onto the film base member adhered to the glass substrate, was subjected to the spin coating, and a sol-gel material layer having thickness of 300 nm was formed. As a spin coater, ACT-300DII (manufactured by ACTIVE, CO., LTD.) was used. Note that the thickness of the coating film was evaluated by an automatic thin-film measuring apparatus Auto SE manufactured by HORIBA, Ltd.

After leaving the film base member, having the sol-gel material layer formed thereon, as it is for 1 minute at a temperature of 25° C., the other (remaining) one of the two film base members each having the size of 100 mm×180 mm was overlaid (overlapped) with a surface of the sol-gel material layer. At this time, the two film base members were overlaid with each other such that the sol-gel material layer was sandwiched between the gas barrier layers, namely, such that the surface, of one of the two film base members, on which the sol-gel material layer was formed, faced (was opposite to) the surface, of the other of the two film base members, on which the gas barrier layer was formed. This test piece was stationarily placed (allowed to stand still) for 1 minute on a hot plate of which temperature was 100° C., and the sol-gel material layer was thus cured, thereby forming a $SiO_X$ layer. Next, the overlaid two film base members were taken out from the glass substrate, and were subjected to cutting out so that a strip-shaped test piece of which size was 25 mm×180 mm was obtained. In such a manner, the test piece having a configuration of the film base member/gas barrier layer ($SiO_X$ layer)/sol-gel material layer ($SiO_X$ layer)/gas barrier layer ($SiO_X$ layer)/film base member, was obtained.

<Evaluation Test for Adhesion Property>

When the obtained test piece was peeled from one end portion thereof at a speed of 100 mm/min in a 180-degree direction (peeled in a T-shaped manner), the film base member was torn, but any peeling did not occur between any layers including between the gas barrier layer and the sol-gel material layer. The peel strength at this time was measured by a tensile tester (model name: Strograph E-L; manufactured by TOYO SEIKI SEISAKU-SHO, LTD.), and the measured value fluctuated between 50 N/m and 80 N/m. Accordingly, it was appreciated that the adhesion force between the gas barrier layer and the sol-gel material layer exceeded 20 N/m.

[Manufacture of Light Emitting Element]
<Manufacture of Film Mold>

At first, a film mold having a concave-convex surface was produced by the BCP solvent annealing method in order to produce a film member provided with a concave-convex structure and to be used as a diffraction grating of a light emitting element. There was prepared a block copolymer manufactured by POLYMER SOURCE INC., and made of polystyrene (hereinafter referred to as "PS" in an abbreviated manner as appropriate) and polymethyl methacrylate (hereinafter referred to as "PMMA" in an abbreviated manner as appropriate) as described below.

Mn of PS segment=680,000
Mn of PMMA segment=580,000
Mn of block copolymer=1,260,000
Volume ratio between PS segment and PMMA segment (PS:PMMA)=57:43
Molecular weight distribution (Mw/Mn)=1.28
Tg of PS segment=107° C.
Tg of PMMA segment=134° C.

The volume ratio between the PS segment and the PMMA segment (the PS segment: the PMMA segment) in the block copolymer was calculated on the assumption that the density of polystyrene was 1.05 g/cm$^3$ and the density of polymethyl methacrylate was 1.19 g/cm$^3$. The number average molecular weights (Mn) and the weight average molecular weights (Mw) of polymer segments or polymers were measured by using a gel permeation chromatography (Model No.: "GPC-8020" manufactured by TOSOH CORPORATION, in which TSK-GEL SuperH1000, SuperH2000, SuperH3000, and SuperH4000 were connected in series). The glass transition temperatures (Tg) of the polymer segments were measured by using a differential scanning calorimeter (manufactured by PERKIN-ELMER, INC. under the product name of "DSC7"), while the temperature was raised at a rate of temperature rise of 20° C./min over a temperature range of 0° C. to 200° C. The solubility parameters of polystyrene and polymethyl methacrylate were 9.0 and 9.3 respectively (see "Kagaku Binran Ouyou Hen" (Handbook of Chemistry, Applied Chemistry), Revised 2nd edition).

Toluene was added to 230 mg of the block copolymer and 57.5 mg of Polyethylene Glycol 2050 (average Mn=2050) manufactured by SIGMA-ALDRICH CO. LLC. as polyethylene oxide so that the total amount thereof was 15 g, followed by dissolving the mixture. Accordingly, a solution of the block copolymer was prepared.

The solution of the block copolymer was filtered through a membrane filter having a pore diameter of 0.5 µm to obtain a block copolymer solution. A glass substrate was coated with a mixed solution containing 1 g of KBM-5103 manufactured by SHIN-ETSU SILICONE (SHIN-ETSU CHEMICAL, CO., LTD.), 1 g of ion-exchanged water, 0.1 ml of acetic acid, and 19 g of isopropyl alcohol, by means of the spin coating (which was performed for 10 seconds with rotation speed of 500 rpm, and then performed continuously for 45 seconds with rotation speed of 800 rpm). The glass substrate was treated for 15 minutes at 130° C., and thus a silane coupling treated glass was obtained. The silane coupling treated glass as the base member was coated with the obtained block copolymer solution by means of the spin coating to provide a thickness in a range of 140 nm to 160 nm. The spin coating was performed for 10 seconds at a rotation speed of 200 rpm and then was performed for 30 seconds at a rotation speed of 300 rpm.

Then, the base member on which the thin film was formed was subjected to a solvent annealing process by being stationarily placed in a desiccator, filled with chloroform vapor in advance, at room temperature for 24 hours. Inside the desiccator (volume: 5 L), a screw-type container charged with 100 g of chloroform was placed, and the atmosphere inside the desiccator was filled with chloroform at the saturated vapor pressure. Concavities and convexities were observed on the surface of the thin film after the solvent annealing process, and it was found that the block copolymer forming the thin film underwent the micro phase separation. The cross section of the thin film was observed by using a transmission electron microscope (TEM) (H-7100FA manufactured by HITACHI, LTD.). As a result, the circular cross section of the PS portion was aligned in two tiers (stages or rows) in a direction perpendicular to the surface of the substrate (height direction) while the circular cross sections of the PS portion were separated from each other in a direction parallel to the surface of the substrate. When considering together with an analysis image obtained by using an atomic force microscope, it was revealed that the PS portion was subjected to the phase separation to form a horizontal cylinder structure from the PMMA portion. A state was given, in which the PS portion existing as the core (island) was surrounded by the PMMA portion (sea).

About 20 nm of a thin nickel layer was formed as a current seed layer by performing the sputtering on the surface of the thin film processed to have the wave-like shape by means of the solvent annealing process as described above. Subsequently, the base member equipped with the thin film was immersed in a nickel sulfamate bath and subjected to an electroforming process (maximum current density: 0.05 A/cm$^2$) at a temperature of 50° C. so as to precipitate nickel until the thickness thereof became 250 µm. The base member equipped with the thin film was mechanically peeled off or released from the nickel electroforming body obtained as described above. Subsequently, the nickel electroforming body was immersed in a tetrahydrofuran solvent for 2 hours, and then the nickel electroforming body was coated with an acrylic-based UV curable resin, followed by being cured and peeled off. This process was repeated three times, and thus polymer component(s) adhered to a part of the surface of the electroforming body was (were) removed. After that, the nickel electroforming body was immersed in Chemisol 2303 manufactured by THE JAPAN CEE-BEE CHEMICAL CO., LTD., and was cleaned or washed while being stirred or agitated for 2 hours at 50° C. Thereafter, the UV ozone treatment was applied to the nickel electroforming body for 10 minutes.

Subsequently, the nickel electroforming body was immersed in HD-2101TH manufactured by DAIKIN CHEMICALS SALES, CO., LTD. for about 1 minute and was dried, and then stationarily placed overnight. The next day, the nickel electroforming body was immersed in HDTH manufactured by DAIKIN CHEMICALS SALES, CO., LTD. and was subjected to an ultrasonic cleaning (washing) process for about 1 minute. In such a manner, a nickel mold for which a mold-release treatment had been performed was obtained.

Subsequently, a PET substrate (COSMOSHINE A-4100 manufactured by TOYOBO CO., LTD.) was coated with a fluorine-based UV curable resin. The fluorine-based UV curable resin was cured by irradiation with ultraviolet light at 600 mJ/cm$^2$ while the nickel mold was pressed thereagainst. After curing of the resin, the nickel mold was exfoliated or peeled off from the cured resin. Accordingly, the film mold, which was composed of the PET substrate with the resin film to which the surface profile (surface shape) of the nickel mold was transferred, was obtained.

<Manufacture of Film Member>

In a similar manner as the manufacture of the test piece for the evaluation test for the adhesion property, a gas barrier layer (SiO$_X$ layer) was formed on a film base member, and was coated with the sol-gel material solution. After the elapse of 60 seconds from the coating of the gas barrier layer with the sol-gel material solution, the film mold manufactured as described above was overlaid to and pressed against a sol-gel material layer, formed on the base member, by use of the pressing roll heated to 80° C. After the completion of the pressing with the film mold, the film mold was released or peeled off from the sol-gel material layer, and then the sol-gel material layer was heated at a temperature of 300° C. for 60 minutes by using an oven, to thereby cure the sol-gel material layer. In such a manner, a concave-convex structure layer made of the sol-gel material layer ($SiO_X$ layer) having the concave-convex pattern of the film mold transferred thereto was formed, and a film member in which the gas barrier layer and the concave-convex structure layer were provided in this order on the film base member was formed. Note that as the pressing roll, there was used a roll which included a heater therein and had the outer circumference covered with heat-resistant silicon of a thickness of 4 mm, the roll having a diameter ($\varphi$) of 50 mm and a length of 350 mm in an axial direction of the shaft.

An analysis image of the shape of the concavities and convexities on the surface of the concave-convex pattern of the concave-convex structure layer was obtained by using an atomic force microscope (a scanning probe microscope equipped with an environment control unit "Nanonavi II Station/E-sweep" manufactured by HITACHI HIGH-TECH SCIENCE CORPORATION). Analysis conditions of the atomic force microscope were as follows.

Measurement mode: dynamic force mode

Cantilever: SI-DF40 (material: Si, lever width: 40 μm, diameter of tip of chip: 10 nm)

Measurement atmosphere: in air

Measurement temperature: 25° C.

<Average Depth of Concavities and Convexities>

A concavity and convexity analysis image was obtained as described above by performing a measurement in a randomly selected measuring region of 10 μm square (length: 10 μm, width: 10 μm) at an arbitrary position in the concave-convex structure layer. Distances between randomly selected concave portions and convex portions in the depth direction were measured at not less than 100 points in the concavity and convexity analysis image, and the average of the distances was calculated as the average depth of the concavities and convexities. The average depth of the concave-convex pattern of the concave-convex structure layer obtained by the analysis image in this example was 70 nm.

<Fourier-Transformed Image of Concavity and Convexity Analysis Image>

A concavity and convexity analysis image was obtained as described above by performing a measurement in a randomly selected measuring region of 10 μm square (length: 10 μm, width: 10 μm) in the concave-convex structure layer. The obtained concavity and convexity analysis image was subjected to the flat processing including primary inclination correction, and then subjected to the two-dimensional fast Fourier transform processing. Thus, a Fourier-transformed image was obtained. It was confirmed that the Fourier-transformed image showed a circular pattern substantially centered at an origin at which an absolute value of wavenumber was 0 μm$^{-1}$, and that the circular pattern was present within a region where the absolute value of wavenumber was in a range of not more than 10 μm$^{-1}$.

The circular pattern of the Fourier-transformed image is a pattern observed due to gathering of bright spots in the Fourier-transformed image. The term "circular" herein means that the pattern of the gathering of the bright spots looks like a substantially circular shape, and is a concept further including a case where a part of the contour of the circular pattern looks like a convex shape or a concave shape. The pattern of the gathering of the bright spots may look like a substantially annular shape, and this case is expressed as the term "annular". It is noted that the term "annular" is a concept further including a case where a shape of an outer circle or inner circle of the ring looks like a substantially circular shape and a case where a part of the contour of the outer circle or the inner circle of the ring looks like a convex shape or a concave shape. Regarding the relationship between the pattern of the concave-convex structure and the Fourier-transformed image, the followings have been revealed. Namely, in a case that the concave-convex structure itself has neither the pitch distribution nor the directivity, the Fourier-transformed image appears to have a random pattern (no pattern). On the other hand, in a case that the concave-convex structure is entirely isotropic in an XY direction but has the pitch distribution, a circular or annular Fourier-transformed image appears. Further, in a case that the concave-convex structure has a single pitch, the annular shape appeared in the Fourier-transformed image tends to be sharp.

The two-dimensional fast Fourier transform processing on the concavity and convexity analysis image can be easily performed by electronic image processing by using a computer equipped with software for the two-dimensional fast Fourier transform processing.

<Average Pitch of Concavities and Convexities>

A concavity and convexity analysis image was obtained as described above by performing a measurement in a randomly selected measuring region of 10 μm square (length: 10 μm, width: 10 μm) in the concave-convex structure layer. Distances between randomly selected adjacent convex portions or between randomly selected adjacent concave portions were measured at not less than 100 points in the concavity and convexity analysis image, and the average of the distances was calculated as the average pitch of the concavities and convexities. The average pitch of the concave-convex pattern of the concave-convex structure layer calculated using the analysis image obtained in this example was 900 nm.

<Average Value of Depth Distribution of Concavities and Convexities>

A concavity and convexity analysis image was obtained by performing a measurement in a randomly selected measuring region of 10 μm square (length: 10 μm, width: 10 μm) in the concave-convex structure layer. While doing so, the data of the depth of concavities and convexities was determined at each of not less than 16,384 (vertical: 128 points× horizontal: 128 points) measuring points in the measuring region on the nanometer scale. By using E-sweep in this example, a measurement at 65,536 points (vertical: 256 points×horizontal: 256 points) (a measurement with a resolution of 256 pixels×256 pixels) was conducted in the measuring region of 10 μm square. With respect to the depth of concavities and convexities (unit: nm) measured in such a manner, at first, a measurement point "P" was determined, among all the measurement points, which was the highest from the surface of the substrate. Then, a plane which included the measurement point P and which was parallel to the surface of the substrate was determined as a reference plane (horizontal plane), and a depth value from the reference plane (difference obtained by subtracting, from the value of height from the substrate at the measurement point P, the height from the substrate at each of the measurement points) was obtained as the data of depth of concavities and convexities. Note that such a depth data of the concavities and convexities was able to be obtained, for example, by performing automatic calculation with software in the E-sweep, and the value obtained by the automatic calculation in such a manner was able to be utilized as the data of depth of concavities and convexities. After obtaining the data of depth of concavity and convexity at each of the measurement points in this manner, the average value (m) of the depth distribution of the concavities and convexities was able to be determined by calculation according to the following formula (I):

[Formula I]

$$m = \frac{1}{N}\sum_{i=1}^{N} x_i \qquad (I)$$

The average value (m) of depth distribution of concavities and convexities of the concave-convex structure layer obtained in this example was 70 nm.

<Standard Deviation of Depth of Concavities and Convexities>

Similar to the method for measuring the average value (m) of the depth distribution, the data of depth of the concavities and convexities were obtained by performing a measurement at not less than 16,384 measuring points (vertical: 128 points×horizontal: 128 points) in a measuring region of 10 μm square of the concave-convex structure layer. In this example, a measurement was performed adopting 65,536 measuring points (vertical: 256 points×horizontal: 256 points). Thereafter, the average value (m) of the depth distribution of the concavities and convexities and the standard deviation (σ) of depth of the concavities and convexities were calculated based on the data of depth of concavities and convexities of the respective measuring points. Note that it was possible to determine the average value (m) by the calculation according to the formula (I) as described above. On the other hand, it was possible to determine the standard deviation (σ) of depth of the concavities and convexities by calculation according to the following formula (II):

[Formula II]

$$\sigma = \sqrt{\frac{1}{N}\sum_{i=1}^{N}(x_i - m)^2} \qquad (II)$$

In the formula (II), "N" represents the total number of measuring points (the number of all the pixels), "$x_i$" represents the data of depth of the concavities and convexities at the i-th measuring point, and "m" represents the average value of the depth distribution of the concavities and convexities. The standard deviation (σ1) of depth of concavities and convexities in the concave-convex structure layer was 48.1 nm.

<Manufacture of Light Emitting Element>

The film member manufactured in the manner as described above was subjected to cutting out to thereby obtain a film member having a size of 23 mm×23 mm, and then a light emitting element was manufactured such that an inner region, of the film member, of which distance from the outer edge (outer peripheral area) of the film member was 6.5 mm became a light emitting portion (having a light emitting area of 10 mm×10 mm), in the following manner. At first, an ITO film having a thickness of 120 nm was formed on the concave-convex structure layer by the sputtering method. Then, a hole transporting layer (4,4',4" tris(9-carbazole)triphenylamine, thickness: 35 nm), a light emitting layer (tris(2-phenylpyridinato)iridium(III) complex-doped 4,4',4' thickness: 15 nm; tris(2-phenylpyridi- nato)iridium(III) complex-doped 1,3,5-tris(N-phenylbenz-imidazole-2-yl)benzene, thickness: 15 nm), and an electron transporting layer (1,3,5-tris(N-phenylbenzimidazole-2-yl) benzene, thickness: 65 nm) were each stacked, as the organic layer, by a vapor deposition method. Further, a lithium fluoride layer (thickness: 1.5 nm) and a metal electrode (aluminum, thickness: 50 nm) were deposited on the stacked body (organic layer). Accordingly, there was obtained a light emitting element 200 in which the gas barrier layer 30, the concave-convex structure layer 60, a transparent electrode as the first electrode 92, the organic layer 94, and a metallic electrode 98 as the second electrode were respectively formed on the film member 40, as depicted in FIG. 4A.

[Evaluation of Current Efficiency]

Regarding the light emitting element manufactured in Example 1, the current efficiency at luminance of 1000 cd/m² was obtained. The result of the current efficiency is indicated in the table in FIG. 5. Regarding the light emitting element manufactured in Example 1, the current efficiency was 98 cd/A.

Note that the current efficiency was measured by the following method. Namely, voltage was applied to the light emitting element, and applied voltage V and electric current I flowing through the light emitting element were measured by a voltage monitor (model name: R6244 manufactured by ADC CORPORATION), and total luminous flux amount L was measured by a total luminous flux measuring device manufactured by SPECTRA CO-OP. The value of luminance (luminance value) L' was calculated from the thus obtained values of the applied voltage V, the electric current I and the total light flux amount L. Regarding the current efficiency, the following formula (F1) was used to calculate the current efficiency of the light emitting element:

$$\text{Current Efficiency}=(L'/I)\times S \qquad (F1)$$

In the formula (F1), S represents a light emitting area of the element. Note that the value of the luminance L' was converted by the following formula (F2) while assuming that the light distribution characteristic of the light emitting element follows the Lambert law:

$$L'=L/\pi/S \qquad (F2)$$

[Evaluation of Deterioration]

After the film formation of the second electrode, a sealing material (UV Resin XNR 5516Z manufactured by NAGASE CHEMTEX CORPORATION) was applied on the outer peripheral portion (at a region not formed with the light emitting layer) of the film member so that the width of the applied sealing material was approximately 1 mm. The application of the sealing material was performed by using a dispense robot (SHOTMASTER 300 manufactured by MUSASHI ENGINEERING, INC.). Then, a sealing glass manufactured by NSG PRECISION KABUSHIKI KAISHA was placed on and pressed against the film member and the sealing material, and then the sealing material was cured by irradiation with UV light at light intensity of 6 J/cm² by using a UV irradiation light source apparatus of which center wavelength was 365 nm.

Deterioration test in a high humidity environment was conducted as follows, by using the light emitting element sealed in the above-described manner in Example 1. At first, voltage of 4 V was applied to the light emitting element in an initial state, and the number of dark spot in the light emitting area was counted. Next, the light emitting element was stored in a thermohygrostat chamber in which the temperature was 50° C. and the humidity was 90%. The applications of the voltage of 4 V to the light emitting element were performed after 3 days and after 14 days, respectively, since the light emitting element had been placed in the thermohygrostat chamber, and each time the number of the dark spot in the light emitting area was counted. A case that the number of dark spot was not more than 20 pieces was considered "pass", and a case that the number of dark spot was more than 20 pieces and a case that the entire light emitting area was non-luminous were considered "failure". The results of evaluation are indicated in the table of FIG. 5. Note that in FIG. 5, a case wherein the number of dark spot was 0 (zero) was indicated by a mark "+"; a case wherein the number of dark spot was greater than 0 and not more than 20 was indicated by "±"; a case wherein the number of dark spot exceeded 20 and the case wherein the entire light emitting area was non-luminous were indicated by a mark "−". In the light emitting element produced in Example 1, the number of dark spot each at the initial state, after 3 days and after 14 days was 0, and passed the evaluation.

Comparative Example 1

[Evaluation of Adhesion Property]
<Manufacture of Test Piece>

A test piece used for the evaluation of adhesion property was manufactured in a similar manner to that in Example 1, except that an $AlO_X$ layer was formed as the gas barrier layer, rather than the $SiO_X$ layer. This test piece had a configuration composed of: film base member/gas barrier layer ($AlO_X$ layer)/sol-gel material layer ($SiO_X$ layer)/gas barrier layer ($AlO_X$ layer)/film base member. The gas barrier layer ($AlO_X$ layer) was formed by the vapor deposition method as follows. At first, the film base member was placed in a vacuum chamber, and the vacuum chamber was evacuated up to $3\times10^{-4}$ Pa. Afterwards, oxygen was introduced into the chamber by using a mass flow meter, and the pressure inside the chamber was adjusted to $5\times10^{-1}$ Pa. An electron beam (EB) was used to heat and melt an aluminum target. Then, a shutter (deposition shutter) on the aluminum target was opened so as to start deposition of the $AlO_X$ onto the film base member. During the deposition, the thickness of the film being formed was monitored by a thickness meter with a crystal oscillator, and the vapor deposition was performed until the $AlO_X$ layer with a 150 nm thickness was formed.

<Evaluation Test for Adhesion Property>

The obtained test piece was subjected to the peeling test in the T-shaped manner, similarly to the peeling test conducted for Example 1, and the peel strength was measured for Comparative Example 1. As the result of T-shaped peeling test, peeling occurred at the interface between the gas barrier layer ($AlO_X$ layer) and the sol-gel material layer ($SiO_X$ layer). The peel strength at this time was 4 N/m. Accordingly, it was appreciated that the adhesion force between the gas barrier layer and the sol-gel material layer was 4 N/m, and that the adhesion force in Comparative Example 1 was weaker than in Example 1.

[Manufacture of Light Emitting Element]

A light emitting element was manufactured in a similar manner to that in Example 1, except that an $AlO_X$ layer was formed as the gas barrier layer, rather than $SiO_X$ layer. The gas barrier layer ($AlO_X$ layer) in Comparative Example 1 was formed in a similar manner as that for forming the gas barrier layer of the test piece used for the evaluation of adhesion property in the Comparative Example 1.

[Evaluation of Current Efficiency]

Regarding the light emitting element manufactured in Comparative Example 1, the current efficiency was obtained in a similar manner as in Example 1. The result of the current efficiency is indicated in the table in FIG. 5. Regarding the light emitting element manufactured in Comparative Example 1, the current efficiency was 95 cd/A.

[Evaluation of Deterioration]

The light emitting element manufactured as described above was sealed in a similar manner to that in Example 1, and the evaluation of deterioration was conducted for the light emitting element in a similar manner as that in Example 1. The results of evaluation are indicated in the table of FIG. 5. In the light emitting element manufactured in Comparative Example 1, any dark spot was not present at the initial state, and passed the evaluation. Although the dark spot occurred after 3 days since the light emitting element had been placed in the thermohygrostat chamber, the number of dark spot was not more than 20, and the light emitting element passed the evaluation. However, the dark spot of which number exceeded 20 occurred after 14 days since the light emitting element had been placed in the thermohygrostat chamber, and thus failed the evaluation.

Comparative Example 2

[Evaluation of Adhesion Property]
<Manufacture of Test Piece>

A test piece used for the evaluation of adhesion property was manufactured in a similar manner to that in Example 1, except that the gas barrier layer was not formed. This test piece of Comparative Example 2 had a configuration composed of: film base member/sol-gel material layer ($SiO_X$ layer)/film base member.

<Evaluation Test for Adhesion Property>

The obtained test piece was subjected to the peeling test in the T-shaped manner, similarly to the peeling test conducted for Example 1, and the peel strength was measured for Comparative Example 2. As the result of T-shaped peeling test, the film base member was torn, but any peeling did not occur between any layers. The measured value of the peel strength at this time fluctuated between 50 N/m and 80 N/m. Accordingly, it was appreciated that the adhesion force between the film base member and the sol-gel material layer exceeded 20 N/m.

[Manufacture of Light Emitting Element]

A light emitting element was manufactured in Comparative Example 2, in a similar manner to that in Example 1, except that the gas barrier layer was not formed.

[Evaluation of Current Efficiency]

Regarding the light emitting element manufactured in Comparative Example 2, the current efficiency was obtained in a similar manner as in Example 1. The result of the current efficiency is indicated in the table in FIG. 5. Regarding the light emitting element manufactured in Comparative Example 2, the current efficiency was 90 cd/A.

[Evaluation of Deterioration]

The light emitting element manufactured as described above in Comparative Example 2 was sealed in a similar manner to that in Example 1, and the evaluation of deterioration was conducted for the light emitting element in a similar manner as that in Example 1. The results of evaluation are indicated in the table of FIG. 5. In the light emitting element manufactured in Comparative Example 2, any dark spot was not present at the initial state, and passed the evaluation. However, the entire light emitting area was non-luminous both after 3 days and 14 days since the light emitting element had been placed in the thermohygrostat chamber, and thus failed the evaluation.

As indicated in the table of FIG. 5, comparison among the results of evaluation of deterioration of Example 1 and Comparative Examples 1 and 2 revealed that the light emitting element having the gas barrier layer formed of $SiO_X$ or $AlO_X$ had smaller deterioration than the light emitting element not having the gas barrier layer. Further, comparison between the result of evaluation of deterioration of Example 1 and that of Comparative Example 1 revealed that the light emitting element having the gas barrier layer formed of $SiO_X$ had smaller deterioration than the light emitting element having the gas barrier layer formed of $AlO_X$. Furthermore, comparison between the result of evaluation of adhesion property of Example 1 and that of Comparative Example 1 revealed that the light emitting element having the gas barrier layer formed of $SiO_X$ had a higher adhesion property between the gas barrier layer and the sol-gel material layer than that in the light emitting element having the gas barrier layer formed of $AlO_X$. From this comparison, it is considered that in the film member having the concave-convex structure, the adhesion property between the concave-convex structure layer and the gas barrier layer can be improved by forming the surface, of the gas barrier layer, making contact with the concave-convex structure layer, of $SiO_X$ which is the material same as that forming the concave-convex structure layer. In a case that the surface, of the gas barrier layer, making contact with the concave-convex structure layer is formed of the material same as that forming the concave-convex structure layer, the adhesion force between the gas barrier layer and the concave-convex structure layer is greater than 20 N/m, and thus the concave-convex structure layer does not peel off from the gas barrier layer during production of the film member, and can sufficiently withstand the producing process of light emitting elements such as organic EL elements. Further, owing to the improved adhesion force between the concave-convex structure layer and the gas barrier layer, it is possible to prevent any moisture and/or gas such as oxygen, etc., from passing through the interface between the concave-convex structure layer and the gas barrier layer, and thus the gas barrier property of the film member is considered to be improved.

Although the present invention has been explained as above with the embodiment, the example, and the comparative examples, the film member of the present invention is not limited to the above-described embodiment and example, and may be appropriately modified or changed within the range of the technical ideas described in the following claims. For example, although the gas barrier layer of the film member in the example is single-layered, the gas barrier layer may be formed of a plurality of layers (may be multi-layered); also in such a case, the uppermost layer, namely a layer (surface) making contact with the concave-convex structure layer, is preferably formed of a material same as the material forming the concave-convex structure layer.

Since the film member of the present invention has the gas barrier layer and the concave-convex structure layer which are formed the inorganic material, the film member has excellent gas barrier property and high light extraction efficiency. Accordingly, a light emitting element using the film member has a high light emitting efficiency and a long service life due to the suppression of the deterioration caused by the moisture and/or gas such as oxygen. Further, since the surface, of the gas barrier layer, which makes contact with the concave-convex structure layer, is made of an material which is same as the material of the concave-convex structure layer, the adhesion property between the gas barrier layer and the concave-convex structure layer is high, and thus the concave-convex structure layer does not peel (exfoliate) from the gas barrier layer. Furthermore, by using a precursor (solution) of the inorganic material for forming the concave-convex structure layer, the concave-convex pattern of the concave-convex structure layer can be formed precisely and assuredly by the roll process, thereby making it possible to produce the film members with high throughput. Therefore, the film member having the concave-convex structure of the present invention is quite effective for a various kinds of devices such as organic EL elements, solar batteries, etc. Further, the film member of the present invention can be used for various kinds of applications, not being limited to the optical substrate. For example, the film member of the present invention can be used also for producing a condensing film and an anti-reflection film for solar batteries and various displays; for producing semiconductor chips; for producing paper such as tissue paper (for example, a drum for compressing web); for producing food such as noodle-making; for production in the biological field such as production of biochips provided with fine channels, biochips for analyzing genome and proteome, cell culture sheets (nanopillar sheets used as a cell culture container), cell separation microchips, etc.; and the like.

What is claimed is:

1. An organic EL element comprising:
    a film member,
    a first electrode, an organic layer and a metal electrode which are successively provided on the film member, in which the film member comprises
    a base member;
    a gas barrier layer formed on the base member; and
    a concave-convex structure layer formed on a surface of the gas barrier layer,
    wherein the surface of the gas barrier layer is formed of an inorganic material which is same as a material of the concave-convex structure layer, and the concave-convex structure layer is obtained from a precursor solution applied on the gas barrier layer,
    wherein the interface between the gas barrier layer and the concave-convex structure layer is flat or smooth, and
    wherein the gas barrier layer is a multi-layered film formed by stacking a plurality of layers including an organic material and at least one inorganic material.

2. The organic EL element according to claim 1, wherein the gas barrier layer is a single layer film.

3. The organic EL element according to claim 1, wherein:
    (i) each of a plurality of convexities and each of a plurality of concavities of the concave-convex structure layer has an elongated shape which extends while winding in a plane view; and
    (ii) the plurality of convexities have extending directions, bending directions and lengths which are non-uniform among the plurality of convexities, and the plurality of concavities have extending directions, bending directions and lengths which are non-uniform among the plurality of concavities.

4. The organic EL element according to claim 1, wherein adhesion force between the gas barrier layer and the concave-convex structure layer is greater than 4 N/m.

5. The organic EL element according to claim 1, wherein an average pitch of a plurality of concavities and a plurality of convexities of the concave-convex structure layer is in a range of 100 nm to 1500 nm; and an average value of depth distribution of the plurality of concavities and the plurality of convexities is in a range of 20 nm to 200 nm.

6. The organic EL element according to claim 1, wherein the gas barrier layer and the concave-convex structure layer each contain a silicon oxide, an aluminum oxide, a silicon nitride, a silicon oxynitride, an aluminum oxynitride, or a magnesium oxide.

7. The organic EL element according to claim 1, wherein the gas barrier layer and the concave-convex structure layer each contain a silicon oxide.

8. The organic EL element according to claim 1, wherein the gas barrier layer has been subject to a surface treatment for enhancing its adhesion property with respect to the concave-convex structure layer.

9. The organic EL element according to claim 8, wherein the surface treatment is a plasma treatment or a corona treatment.

10. The organic EL element according to claim 1, wherein the gas barrier layer has thickness in a range of 5 nm to 2000 nm.

* * * * *